US012426348B2

(12) United States Patent
Cheng et al.

(10) Patent No.: US 12,426,348 B2
(45) Date of Patent: Sep. 23, 2025

(54) SEMICONDUCTOR DEVICE AND METHOD FOR FORMING THE SAME

(71) Applicant: TAIWAN SEMICONDUCTOR MANUFACTURING COMPANY, LTD., Hsinchu (TW)

(72) Inventors: Po-Hsien Cheng, Hsinchu (TW); Zhen-Cheng Wu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 613 days.

(21) Appl. No.: 17/844,865

(22) Filed: Jun. 21, 2022

(65) Prior Publication Data

US 2023/0411217 A1    Dec. 21, 2023

(51) Int. Cl.
  *H10D 84/03* (2025.01)
  *H01L 21/3213* (2006.01)
  *H10D 84/01* (2025.01)
  *H10D 84/83* (2025.01)

(52) U.S. Cl.
  CPC ..... *H10D 84/038* (2025.01); *H01L 21/32139* (2013.01); *H10D 84/013* (2025.01); *H10D 84/0151* (2025.01); *H10D 84/0158* (2025.01); *H10D 84/834* (2025.01)

(58) Field of Classification Search
  CPC .............. H10D 84/038; H10D 84/013; H10D 84/0151; H10D 84/0158; H10D 84/834; H01L 21/32139; H01L 21/02205; H01L 21/02274; H01L 21/0228; H01L 21/02175
  See application file for complete search history.

(56) References Cited

U.S. PATENT DOCUMENTS

| | | | |
|---|---|---|---|
| 2017/0243944 A1* | 8/2017 | Li | H10B 10/12 |
| 2020/0091320 A1* | 3/2020 | Liaw | H10B 10/12 |
| 2021/0343713 A1* | 11/2021 | Ju | H01L 21/28123 |
| 2022/0367481 A1* | 11/2022 | Yang | H10D 30/6735 |

OTHER PUBLICATIONS

Neureither et al., "Boron Nitride and Silicon Boron Nitride Film and Polish Characterization", Journal of The Electrochemical Society, 1993, vol. 140, No. 12, pp. 3607-3611.

* cited by examiner

*Primary Examiner* — Fernando L Toledo
*Assistant Examiner* — Shawn Shaw Muslim
(74) *Attorney, Agent, or Firm* — Birch, Stewart, Kolasch & Birch, LLP

(57) ABSTRACT

A method includes forming a semiconductor fin over a substrate; forming first, second, and third gate structures crossing the semiconductor fin; forming first and second epitaxial source/drain structures on opposite sides of the first gate structure, and forming third and fourth source/drain epitaxial structures on opposite sides of the third gate structure; forming first gate spacers, second gate spacers, third gate spacers on opposite sidewalls of the first, second, and third gate structures, respectively; forming a first hard mask over the first, second, and third gate structures; patterning the first hard mask to form a first opening; etching a portion of the second gate structure and a portion of the semiconductor fin through the first opening to form a recess; and forming a dielectric layer in the recess, in which a dielectric constant of the dielectric layer is lower than a dielectric constant of silicon oxide.

20 Claims, 45 Drawing Sheets

SEMICONDUCTOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
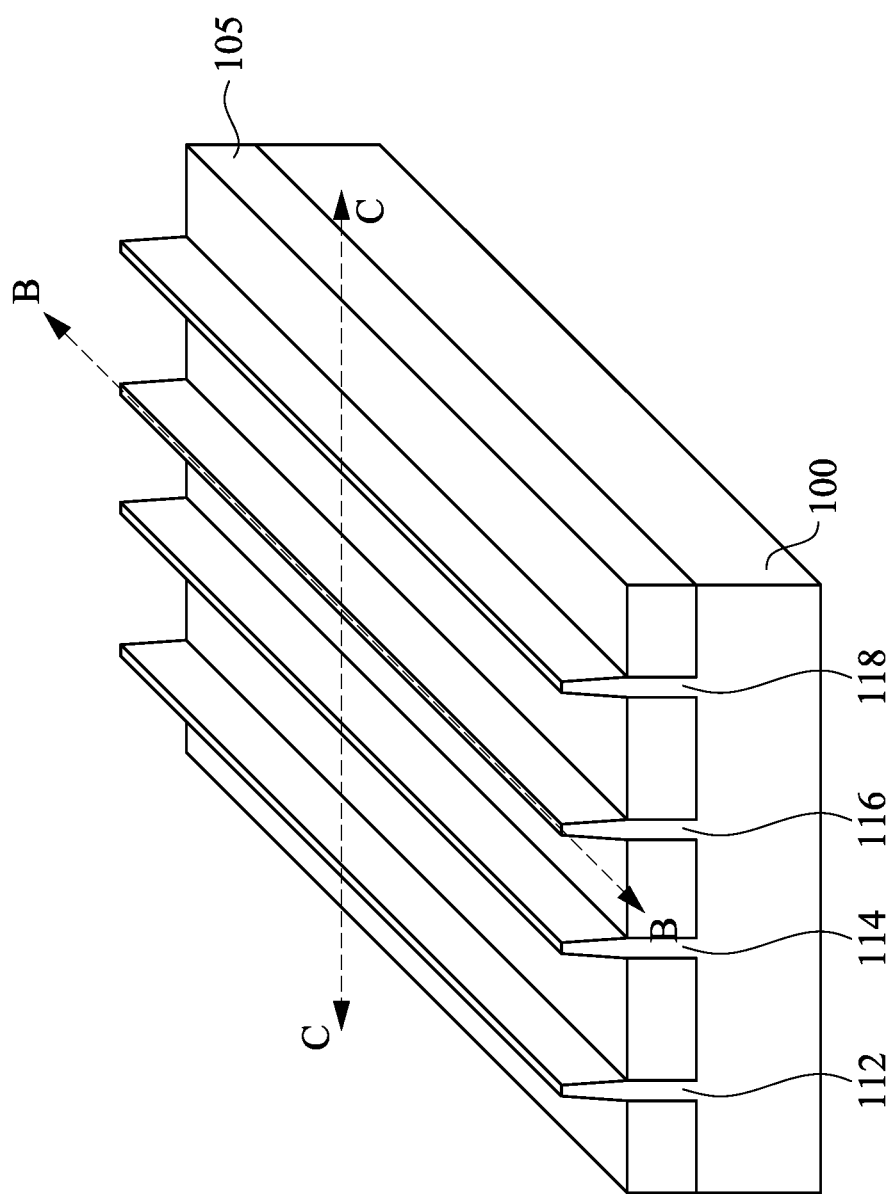
FIGS. 1A to 14C illustrate a method for manufacturing a semiconductor device at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 14C illustrate a method for manufacturing a semiconductor device at various stages in accordance with some embodiments of the present disclosure.

Figure 1B:
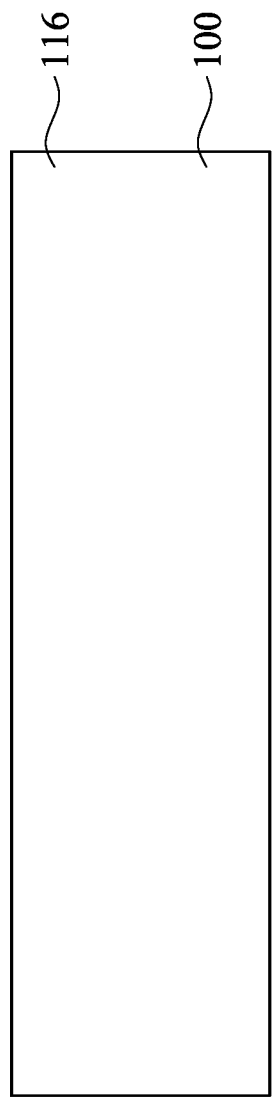
Figure 1C:
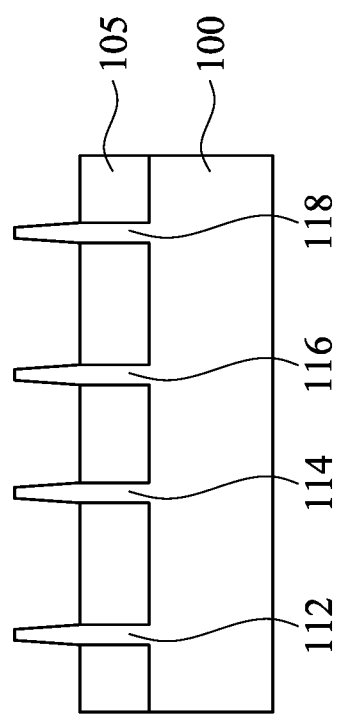

Reference is made to FIGS. 1A to 1C, in which FIG. 1B is a cross-sectional view along line B-B of FIG. 1A, and FIG. 1C is a cross-sectional view along line C-C of FIG. 1A. Shown there is a substrate 100. The substrate 100 may be a semiconductor substrate, such as a bulk semiconductor, a semiconductor-on-insulator (SOI) substrate, or the like. The substrate 100 may be a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Semiconductor fins 112, 114, 116, and 118 are formed over the substrate 100. The semiconductor fins 112, 114, 116, and 118 may be formed by, for example, forming a mask layer over the substrate 100, in which the mask layer may include openings that expose portions of the substrate 100. The exposed substrate 100 is then etched through the openings of the mask layer, forming trenches in the substrate 100. A portion of the substrate 100 between neighboring trenches can be referred to as the semiconductor fin.

Isolation structures 105 may be formed over the substrate 100 and laterally surrounding bottom portions of the semiconductor fins 112, 114, 116, and 118. The isolation structures 105 can be referred to as shallow trench isolation (STI) structures. The isolation structures 105 can be formed by, for example depositing a dielectric material blanket over the substrate 100 and overfilling the spaces between the semiconductor fins 112, 114, 116, and 118, performing a planarization process such as chemical mechanical polish (CMP) to remove excess dielectric material until the top surfaces of the semiconductor fins 112, 114, 116, and 118 are exposed. Afterward, the dielectric material is recessed, for example, through an etching operation, in which diluted HF, SiCoNi (including HF and NH 3), or the like, may be used as the etchant. After recessing the isolation structures 105, top portions of the semiconductor fins 112, 114, 116, and 118 are higher than the top surfaces of the isolation structures 105, and hence top portions of the semiconductor fins 112, 114, 116, and 118 protrude above the isolation structures 105.

In some embodiments, the isolation structures 105 are made of silicon oxide, silicon nitride, silicon oxynitride, fluoride-doped silicate glass (FSG), or other low-K dielectric materials. In some embodiments, the isolation dielectric 160 may be formed using a high-density-plasma (HDP) chemical vapor deposition (CVD) process, using silane ($SiH_4$) and oxygen ($O_2$) as reacting precursors. In some other embodiments, the isolation structures 105 may be formed using a sub-atmospheric CVD (SACVD) process or high aspect-ratio process (HARP), in which process gases may include tetraethylorthosilicate (TEOS) and ozone ($O_3$). In yet other embodiments, the isolation structures 105 may be formed using a spin-on-dielectric (SOD) process, such as hydrogen silsesquioxane (HSQ) or methyl silsesquioxane (MSQ). Other processes and materials may be used. In some embodiments, the isolation structures 105 can have a multi-layer structure, for example, a thermal oxide liner layer with silicon nitride formed over the liner. Thereafter, a thermal annealing may be optionally performed to the isolation structures 105.

Figure 2A:
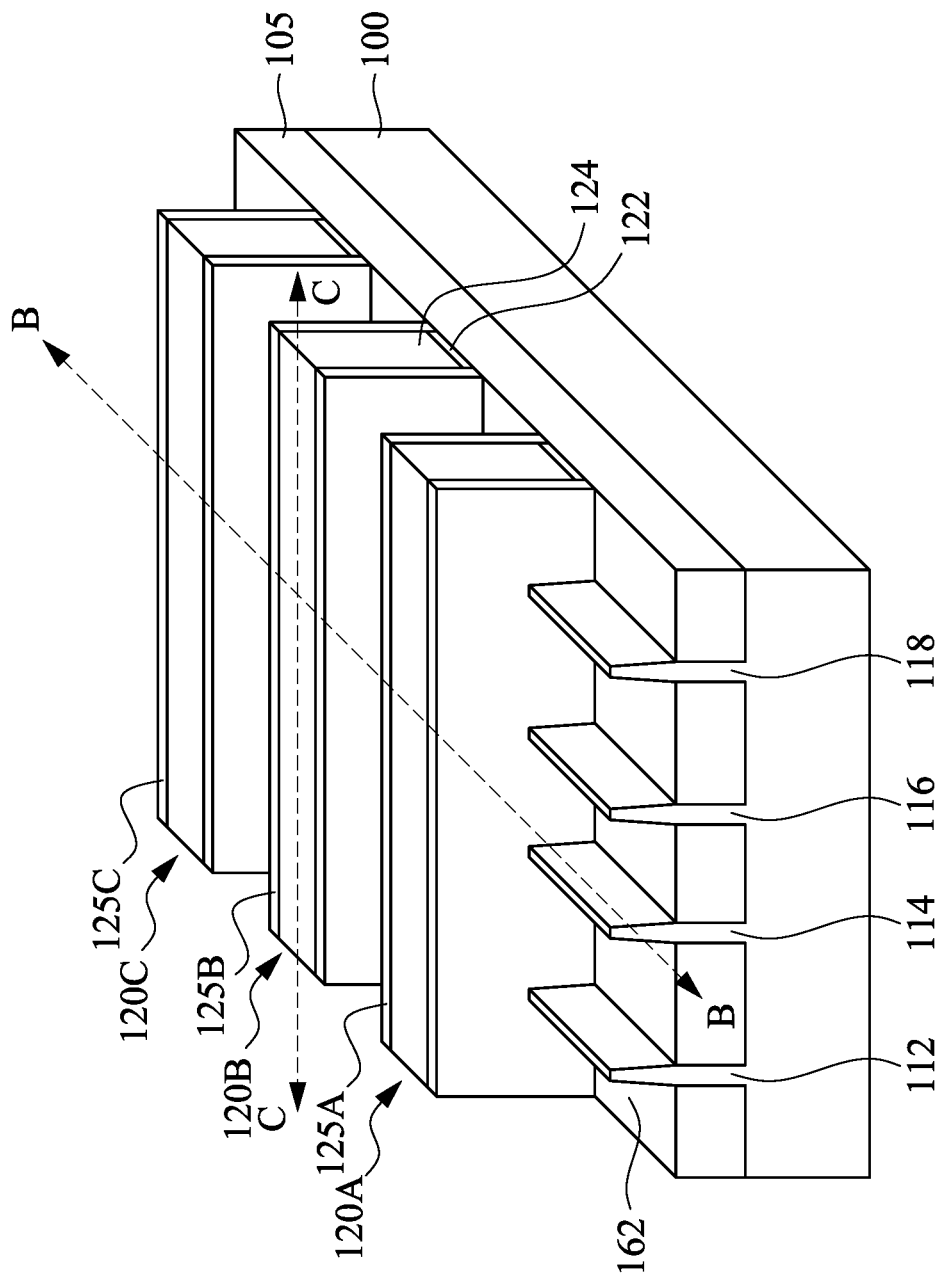
Figure 2B:
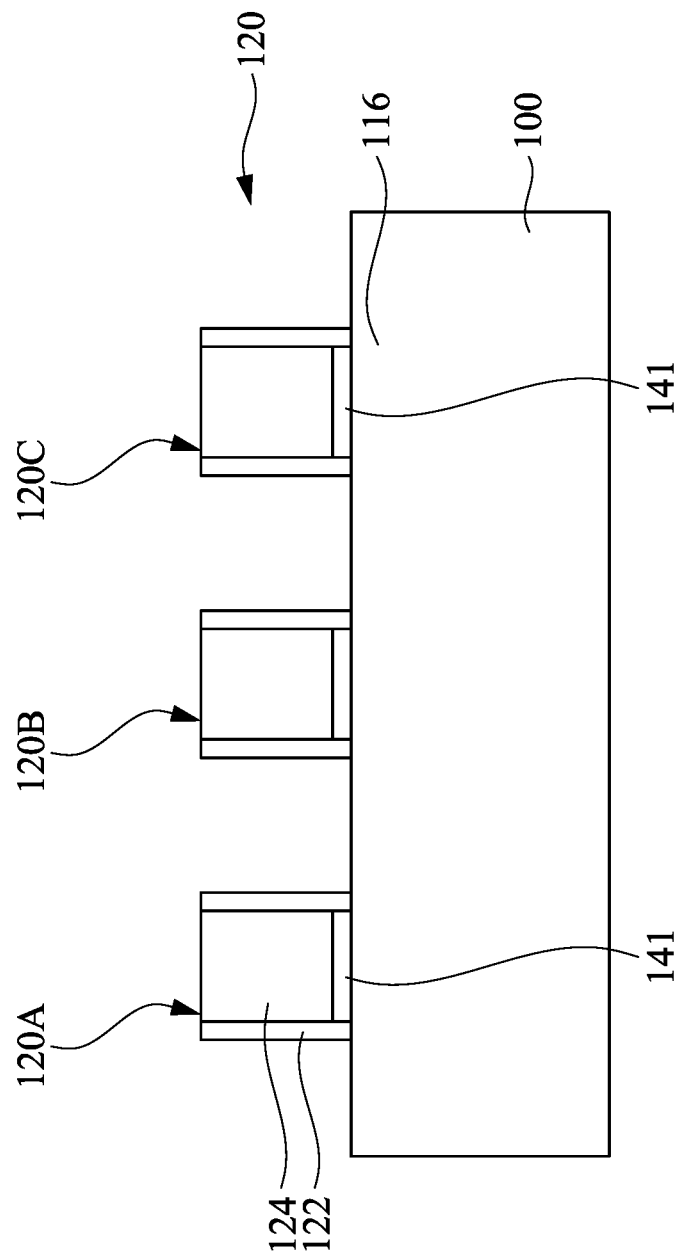
Figure 2C:
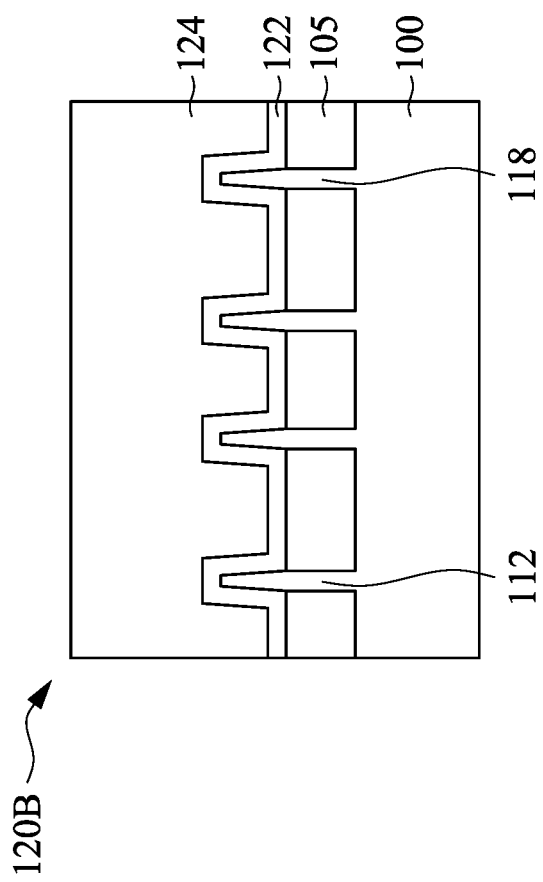

Reference is made to FIGS. 2A to 2C, in which FIG. 2B is a cross-sectional view along line B-B of FIG. 2A, and FIG. 2C is a cross-sectional view along line C-C of FIG. 2A. Dummy gate structures 120A, 120B, are 120C are formed over the substrate 100 and crossing the semiconductor fins 112, 114, 116, and 118. In some embodiments, each of the dummy gate structures 120A, 120B, and 120C includes a gate dielectric layer 122 and a gate electrode 124 over the gate dielectric layer 122. The dummy gate structures 120A, 120B, and 120C may be formed by, for example, depositing a gate dielectric material blanket over the substrate 100, depositing a gate electrode material over the gate dielectric material, and then patterning the gate dielectric material and the gate electrode material.

In some embodiments, the gate dielectric layer 122 is an oxide layer, such as silicon oxide. In some embodiments, the gate dielectric layer 122 is made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The gate dielectric layer 122 may be formed by a deposition processes, such as chemical vapor deposition (CVD), physical vapor deposition (PVD), atomic layer deposition (ALD), plasma enhanced CVD (PECVD) or other suitable techniques.

In some embodiments, the gate electrode 124 may include polycrystalline-silicon (poly-Si), poly-crystalline silicon-germanium (poly-SiGe), metallic nitrides, metallic silicides, metallic oxides, or metals. In some embodiments, the gate electrode 124 includes a metal-containing material such as TiN, TaN, TaC, Co, Ru, Al, combinations thereof, or multi-layers thereof. The gate electrode 124 may be deposited by CVD, physical vapor deposition (PVD), sputter deposition, or other techniques suitable for depositing conductive materials.

Gate spacers 125A, 125B, and 125C are formed. In greater details, the gate spacers 125A are formed on opposite sidewalls of the gate structure 120A, the gate spacers 125B are formed on opposite sidewalls of the gate structure 120B, and the gate spacers 125C are formed on opposite sidewalls of the gate structure 120C.

In some embodiments, the gate spacers 125A, 125B, and 125C may include silicon oxide, silicon nitride, silicon oxynitride, silicon carbide, silicon carbonitride, silicon oxy-carbonitride, silicon oxycarbide, porous dielectric materials, hydrogen doped silicon oxycarbide (SiOC:H), low-k dielectric materials or other suitable dielectric material. The gate spacers 125A, 125B, and 125C may include a single layer or multilayer structure made of different dielectric materials. The method of forming the gate spacers 125A, 125B, and 125C includes blanket forming a dielectric layer over the substrate 100 using, for example, CVD, PVD or ALD, and then performing an etching process such as anisotropic etching to remove horizontal portions of the dielectric layer. The remaining portions of the dielectric layer on sidewalls of the dummy gate structures 120A, 120B, and 120C can serve as the gate spacers 125A, 125B, and 125C, respectively. In some embodiments, the gate spacers 125A, 125B, and 125C may be used to offset subsequently formed source/drain regions. The gate spacers 125A, 125B, and 125C may further be used for designing or modifying the source/drain region profile.

Figure 3A:
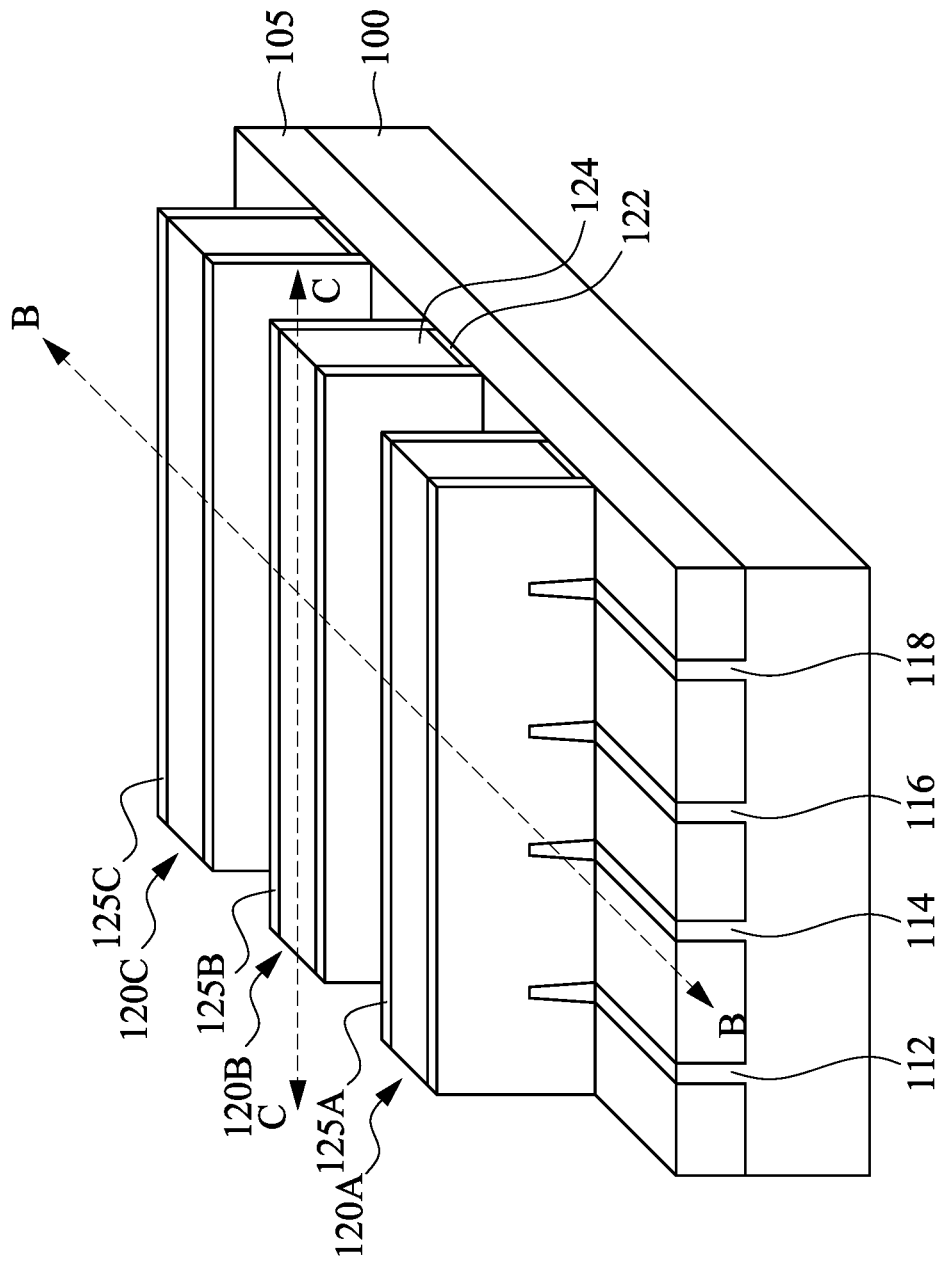
Figure 3B:
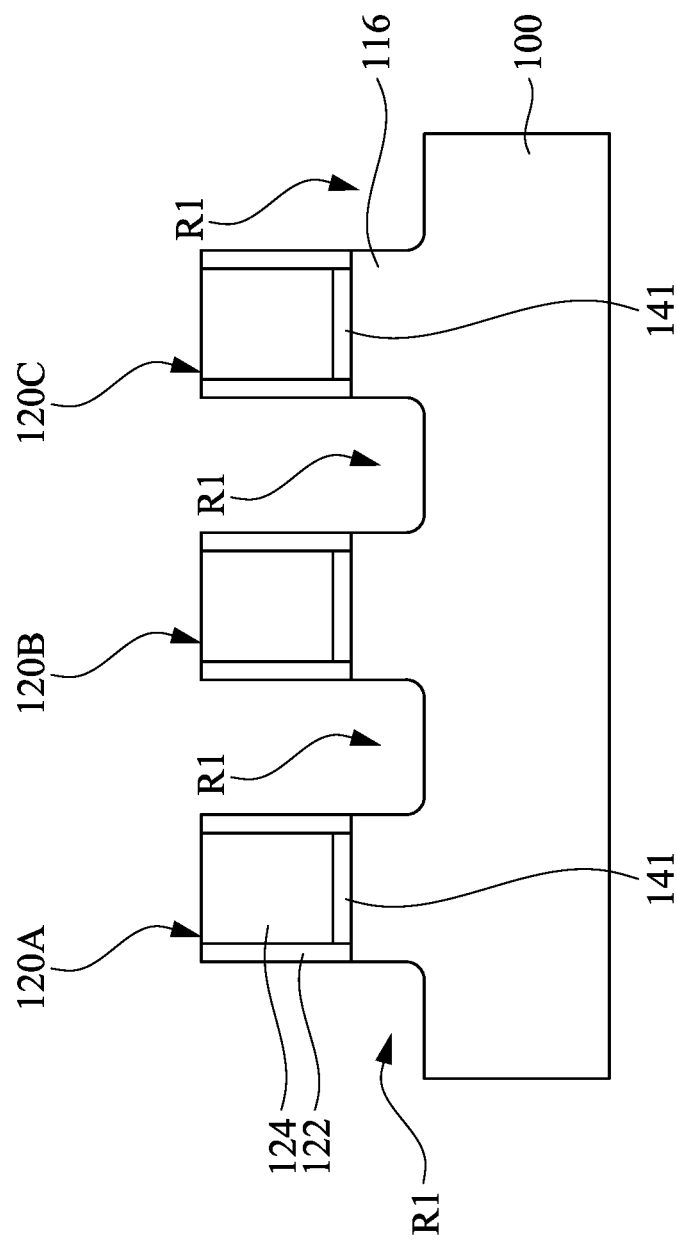
Figure 3C:
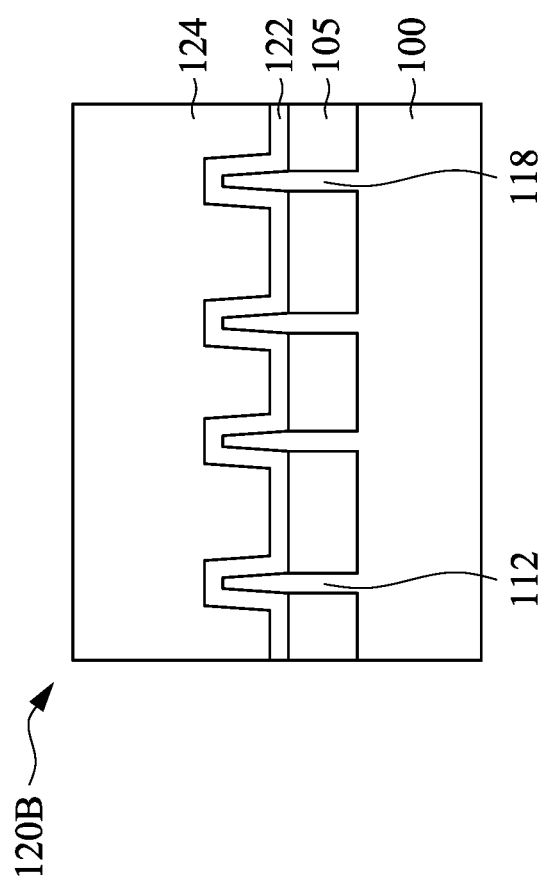

Reference is made to FIGS. 3A to 3C, in which FIG. 3B is a cross-sectional view along line B-B of FIG. 3A, and FIG. 3C is a cross-sectional view along line C-C of FIG. 3A. Portions of the semiconductor fins 112, 114, 116, and 118 not covered by the dummy gate structures 120A, 120B, are 120C and the gate spacers 125A, 125B, are 125C are partially removed (or partially recessed) to form recesses R1. The portions of the semiconductor fins 112, 114, 116, and 118 under the dummy gate structures 120A and 120C may act as channel regions of transistors.

Formation of the recesses R1 may include a dry etching process, a wet etching process, or combination dry and wet etching processes. This etching process may include reactive ion etch (RIE) using the dummy gate structures 120A, 120B, are 120C and gate spacers 125A, 125B, are 125C as masks, or by any other suitable removal process. After the etching process, a pre-cleaning process may be performed to clean the recesses R1 with hydrofluoric acid (HF) or other suitable solution in some embodiments.

Figure 4A:
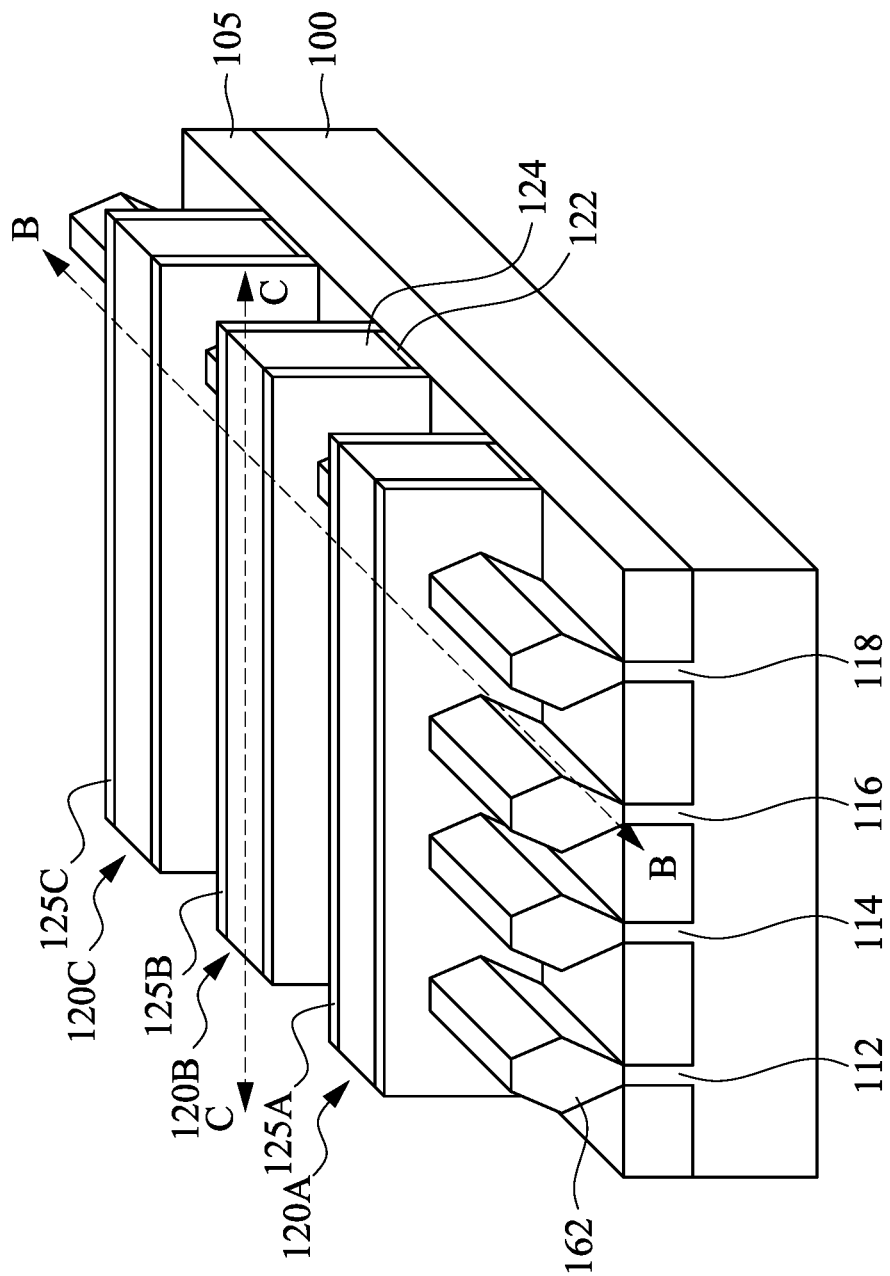
Figure 4B:
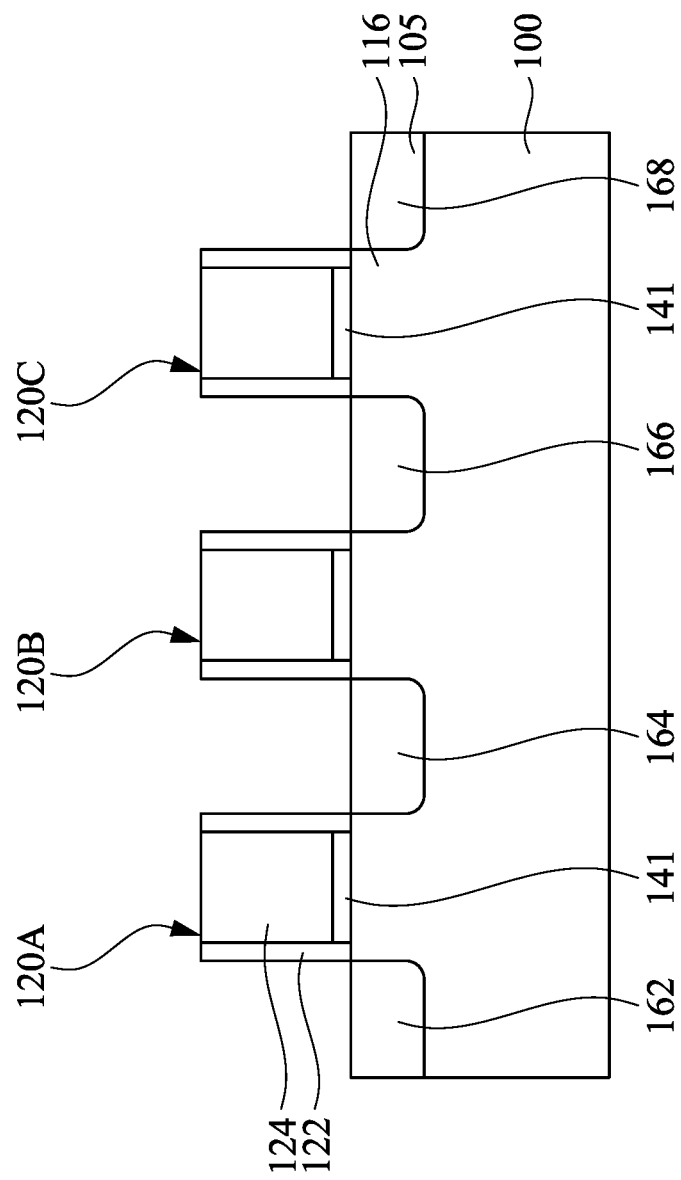
Figure 4C:
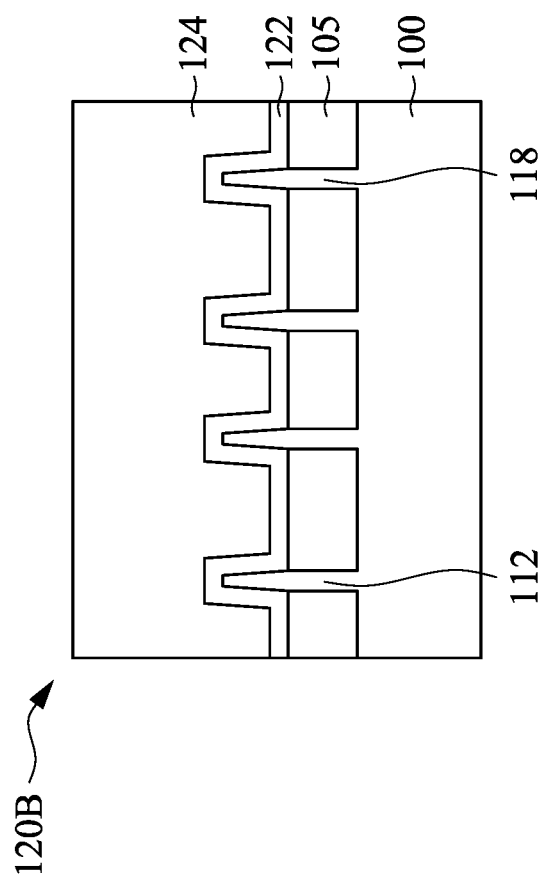

Reference is made to FIGS. 4A to 4C, in which FIG. 4B is a cross-sectional view along line B-B of FIG. 4A, and FIG. 4C is a cross-sectional view along line C-C of FIG. 4A. Epitaxial source/drain structures 162, 164, 166, and 168 are formed in the recesses R1 of the semiconductor fins 112, 114, 116, and 118, respectively. In greater details, as shown in the cross-sectional view of FIG. 4B, the epitaxial source/drain structures 162 and 164 are formed on opposite sides of the gate structure 120A, the epitaxial source/drain structures 164 and 166 are formed on opposite sides of the gate structure 120B, and the epitaxial source/drain structures 166 and 168 are formed on opposite sides of the gate structure 120C. Source/drain region(s) may refer to a source or a drain, individually or collectively dependent upon the context.

The epitaxial source/drain structures 162, 164, 166, and 168 may be formed using one or more epitaxy or epitaxial (epi) processes, such that Si features, SiGe features, silicon phosphate (SIP) features, silicon carbide (SiC) features and/or other suitable features can be formed in a crystalline state on the recessed portions of the semiconductor fins 112, 114, 116, and 118. In some embodiments, lattice constants of the epitaxial source/drain structures 162, 164, 166, and 168 are different from that of the semiconductor fins 112, 114, 116, and 118, so that the channel region between the epitaxial source/drain structures 162, 164, 166, and 168 can be strained or stressed by the epitaxial source/drain structures 162, 164, 166, and 168 to improve carrier mobility of the semiconductor device and enhance the device performance.

The epitaxy processes include CVD deposition techniques (e.g., vapor-phase epitaxy (VPE) and/or ultra-high vacuum CVD (UHV-CVD)), molecular beam epitaxy, and/or other suitable processes. The epitaxy process may use gaseous and/or liquid precursors, which interact with the composition of the semiconductor fins 162, 164, 166, and 168 (e.g., silicon, silicon germanium, silicon phosphate, or the like). The epitaxial source/drain structures 162, 164, 166, and 168 may be in-situ doped. The doping species include p-type dopants, such as boron or $BF_2$; n-type dopants, such as phosphorus or arsenic; and/or other suitable dopants including combinations thereof. If the epitaxial source/drain structures 162, 164, 166, and 168 are not in-situ doped, a second implantation process (i.e., a junction implant process) is performed to dope the epitaxial source/drain structures 162, 164, 166, and 168. One or more annealing processes may be performed to activate the epitaxial source/drain structures 162, 164, 166, and 168. The annealing processes include rapid thermal annealing (RTA) and/or laser annealing processes.

Figure 5A:
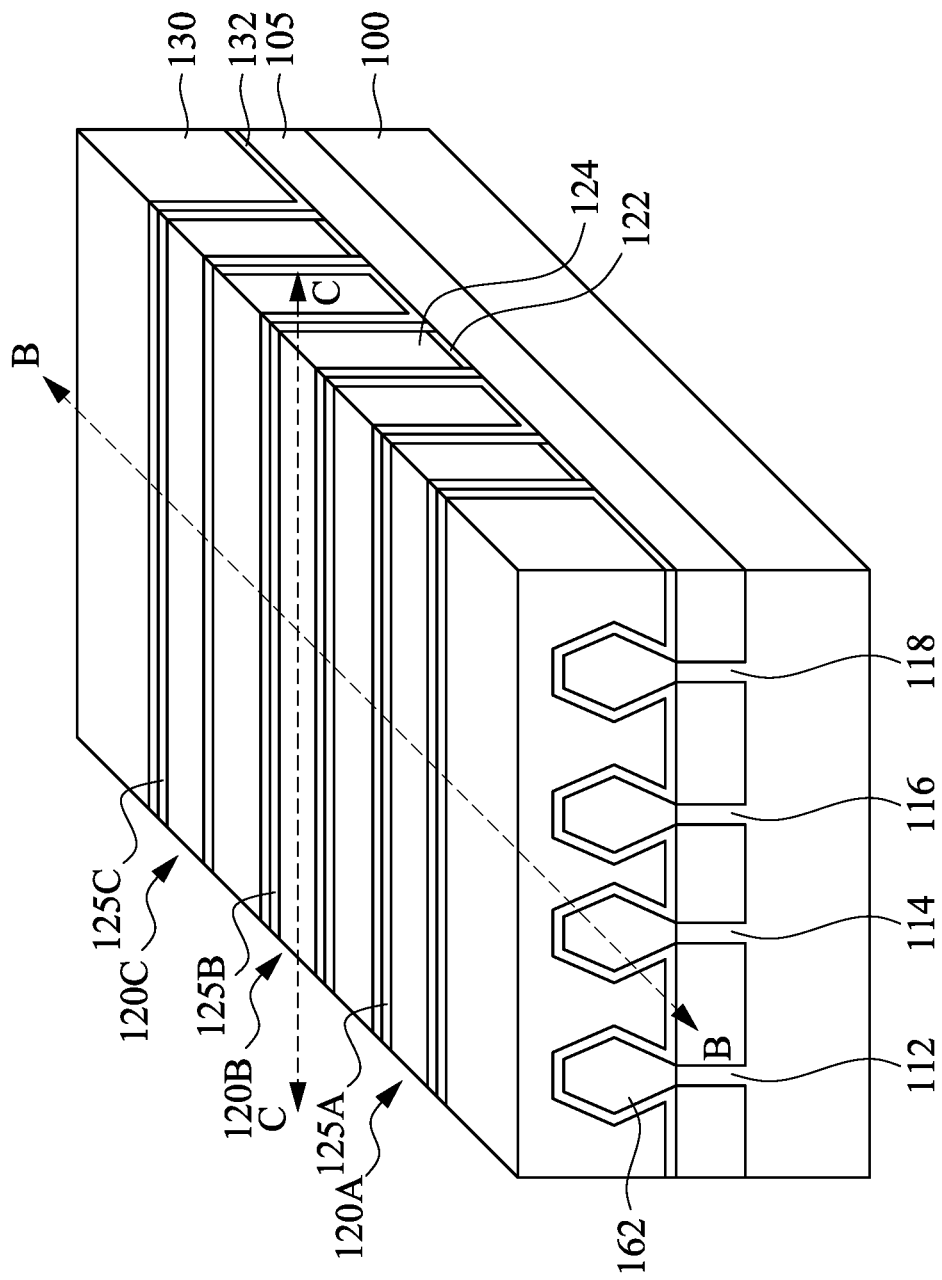
Figure 5B:
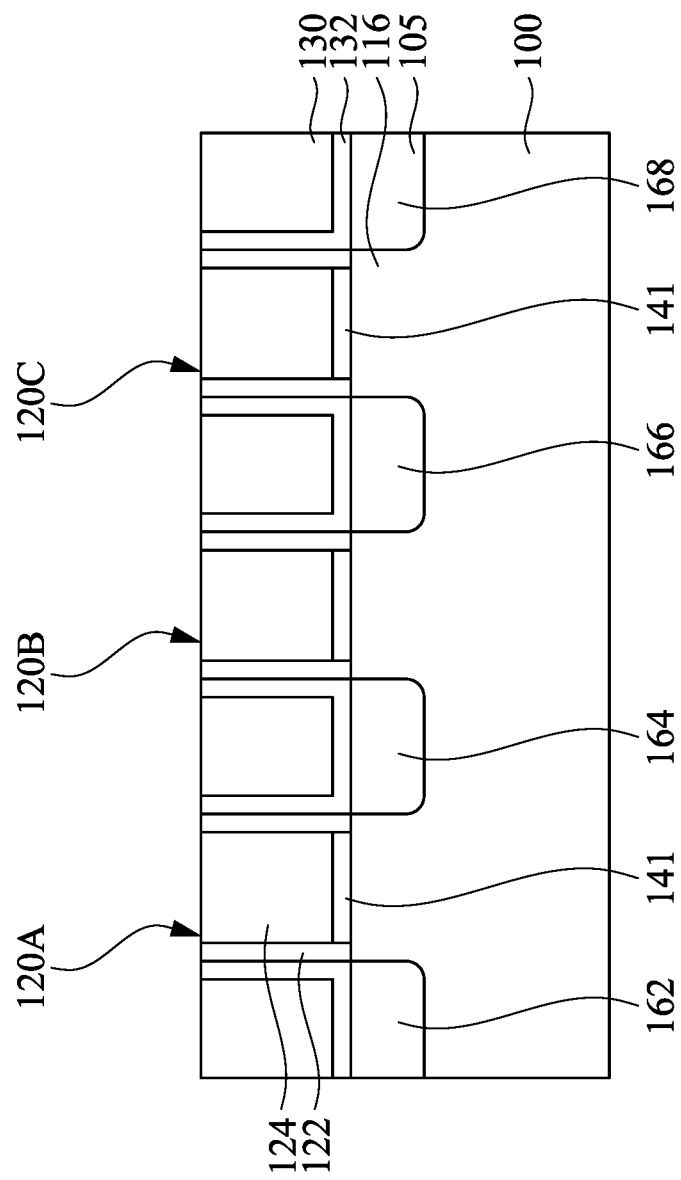
Figure 5C:
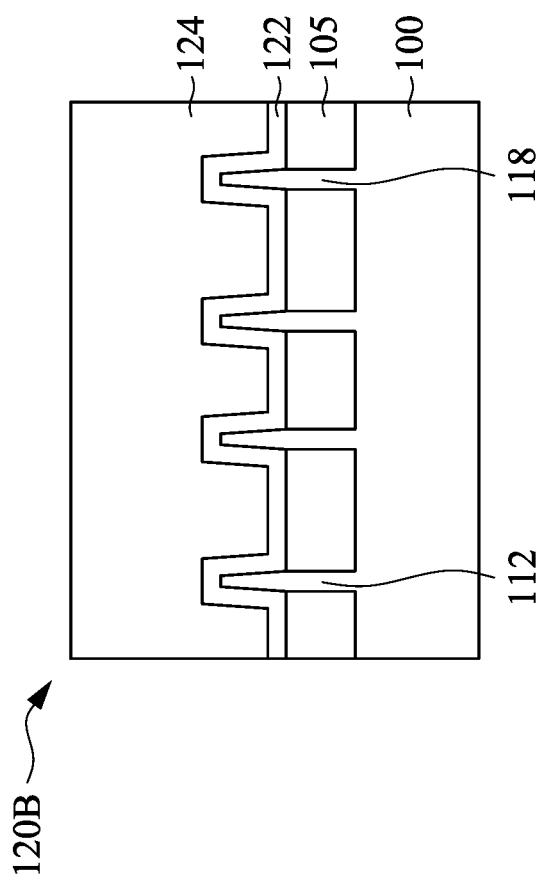

Reference is made to FIGS. 5A to 5C, in which FIG. 5B is a cross-sectional view along line B-B of FIG. 5A, and FIG. 5C is a cross-sectional view along line C-C of FIG. 5A. A contact etch stop layer (CESL) 132 is blanket formed on the structure shown in FIGS. 4A to 4C, and then, an interlayer dielectric (ILD) layer 130 is formed on the CESL 132. Afterwards, a CMP process may be optionally performed to remove excessive materials of the ILD layer 130 and the CESL 132 to expose the dummy gate structures 120A, 120B, and 120C. The CMP process may planarize a top surface of the ILD layer 130 with top surfaces of the dummy gate structures 120A, 120B, and 120C, gate spacers 125A, 125B, and 125C and the CESL 132 in some embodiments. The CESL 132 may be a dielectric layer including silicon nitride, silicon oxynitride or other suitable materials. The CESL 132 can be formed using, for example, plasma enhanced CVD, low pressure CVD, ALD or other suitable techniques. The ILD layer 130 may include a material different from the CESL 132. In some embodiments, the ILD layer 130 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 130 may be formed using, for example, CVD, ALD, spin-on-glass (SOG) or other suitable techniques.

Figure 6A:
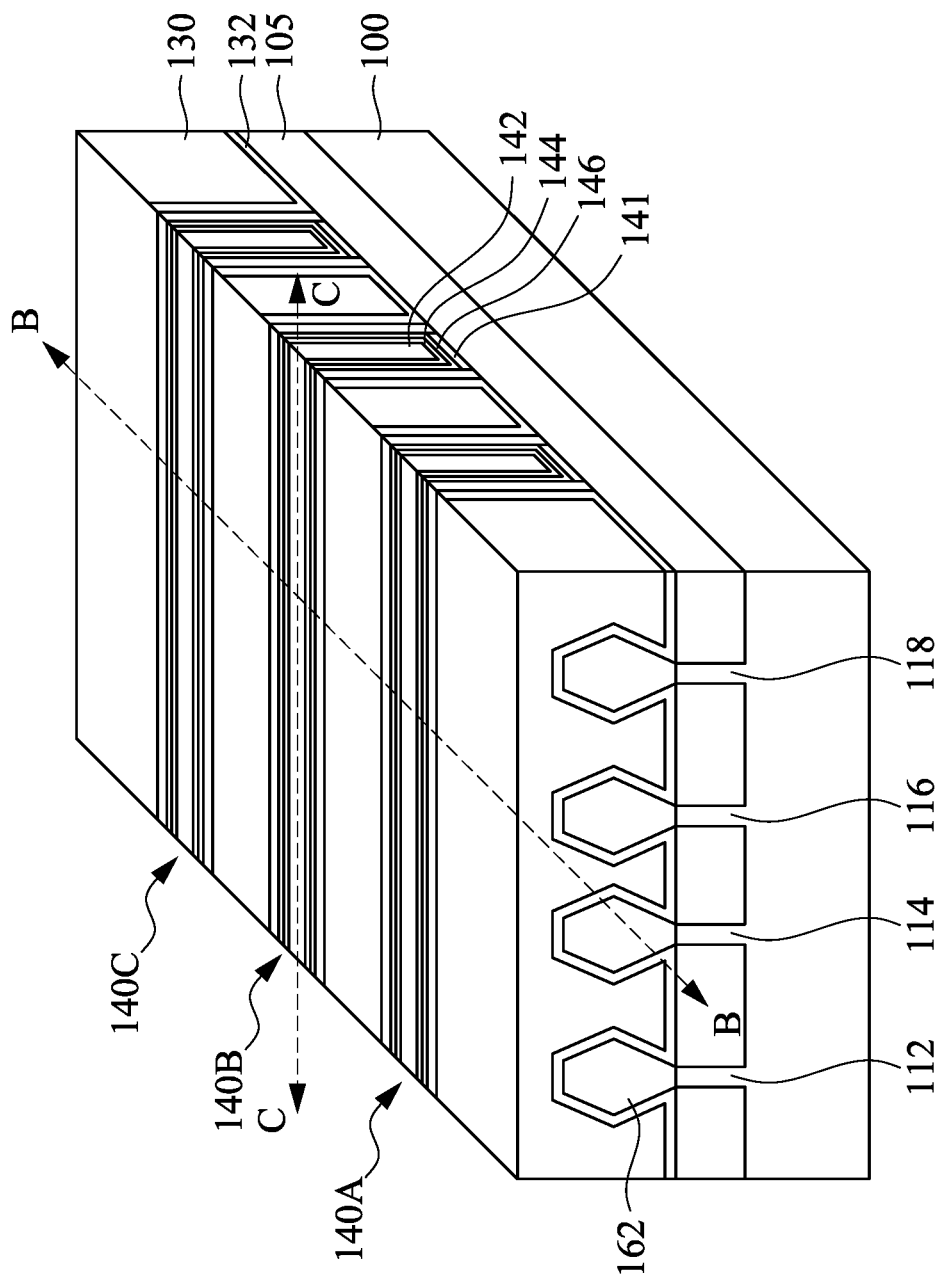
Figure 6B:
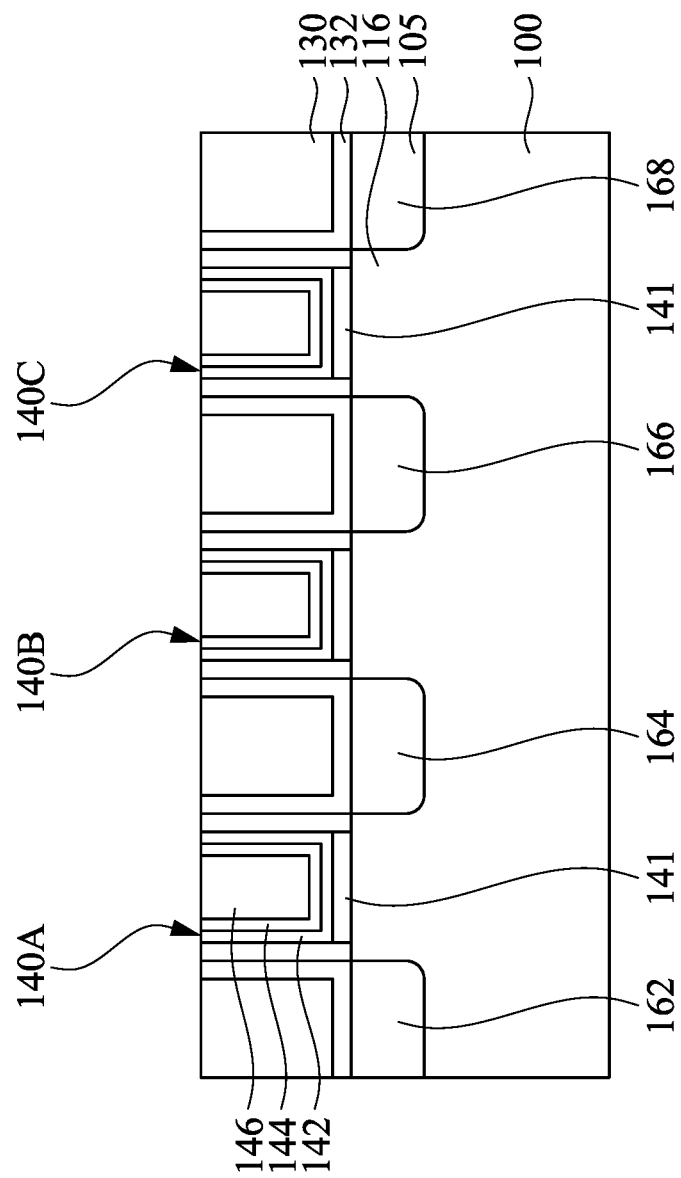
Figure 6C:
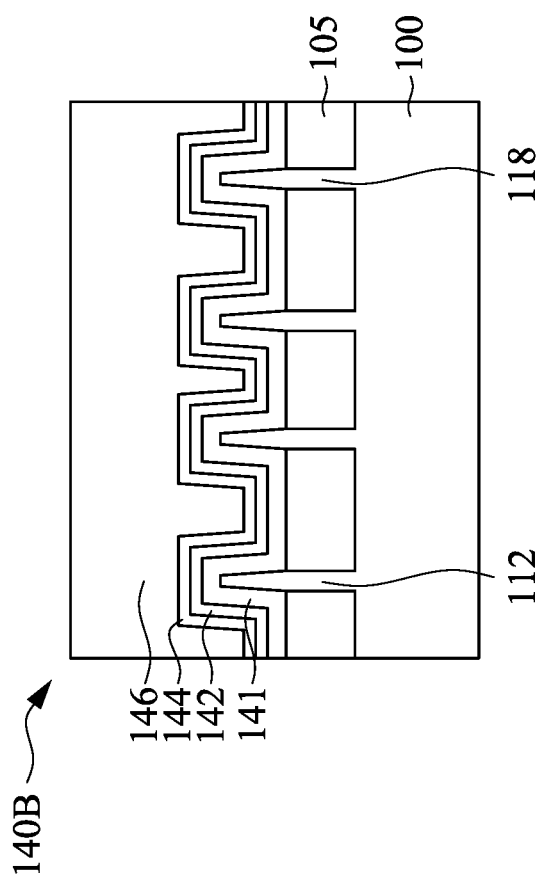

Reference is made to FIGS. 6A to 6C, in which FIG. 6B is a cross-sectional view along line B-B of FIG. 6A, and FIG. 6C is a cross-sectional view along line C-C of FIG. 6A. The dummy gate structures 120A, 120B, and 120C are replaced with metal gate structures 140A, 140B, and 140C, respectively. In some embodiments using a gate-last process, the dummy gate structures 120A, 120B, and 120C may be removed to form gate trenches within the gate spacers 125A, 125B, and 125C, respectively. A plurality of layers included in the metal gate structures 140A, 140B, and 140C may be sequentially deposited in the gate trenches. Then, a CMP process is performed to remove excessive materials to form the metal gate structures 140A, 140B, and 140C. In some embodiments, each of the metal gate structures 140A, 140B, and 140C may include an interfacial layer 141, a gate dielectric layer 142, a work function metal layer 144, and a gate electrode 146.

The interfacial layer 141 is selectively formed on exposed surfaces of the semiconductor fins 112, 114, 116, and 118. In some embodiments, the interfacial layer 141 may be formed by performing an oxidation process. In some embodiments, the interfacial layer 141 is made of oxide, such as silicon oxide.

In some embodiments, the gate dielectric layer 142 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The gate dielectric layer 142 may be formed by CVD, ALD or any suitable method.

In some embodiments, the work function metal layer 144 may be made of a conductive material such as a single layer of TiN, TaN, TaAlC, TiC, TaC, Co, Al, TiAl, HfTi, TiSi, TaSi or TiAlC, or a multilayer of two or more of these materials. For the n-channel FET, one or more of TaN, TaAlC, TiN, TiC, Co, TiAl, HfTi, TiSi and TaSi is used as the work function metal layer 144, and for the p-channel FET, one or more of TiAlC, Al, TiAl, TaN, TaAlC, TiN, TiC and Co is used as the work function metal layer 144. The work function metal layer 144 may be formed by ALD, PVD, CVD, e-beam evaporation, or other suitable process.

In some embodiments, the gate electrode 146 may include one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. The gate electrode 146 may be formed by CVD, ALD, electro-plating, or other suitable method.

Figure 7A:
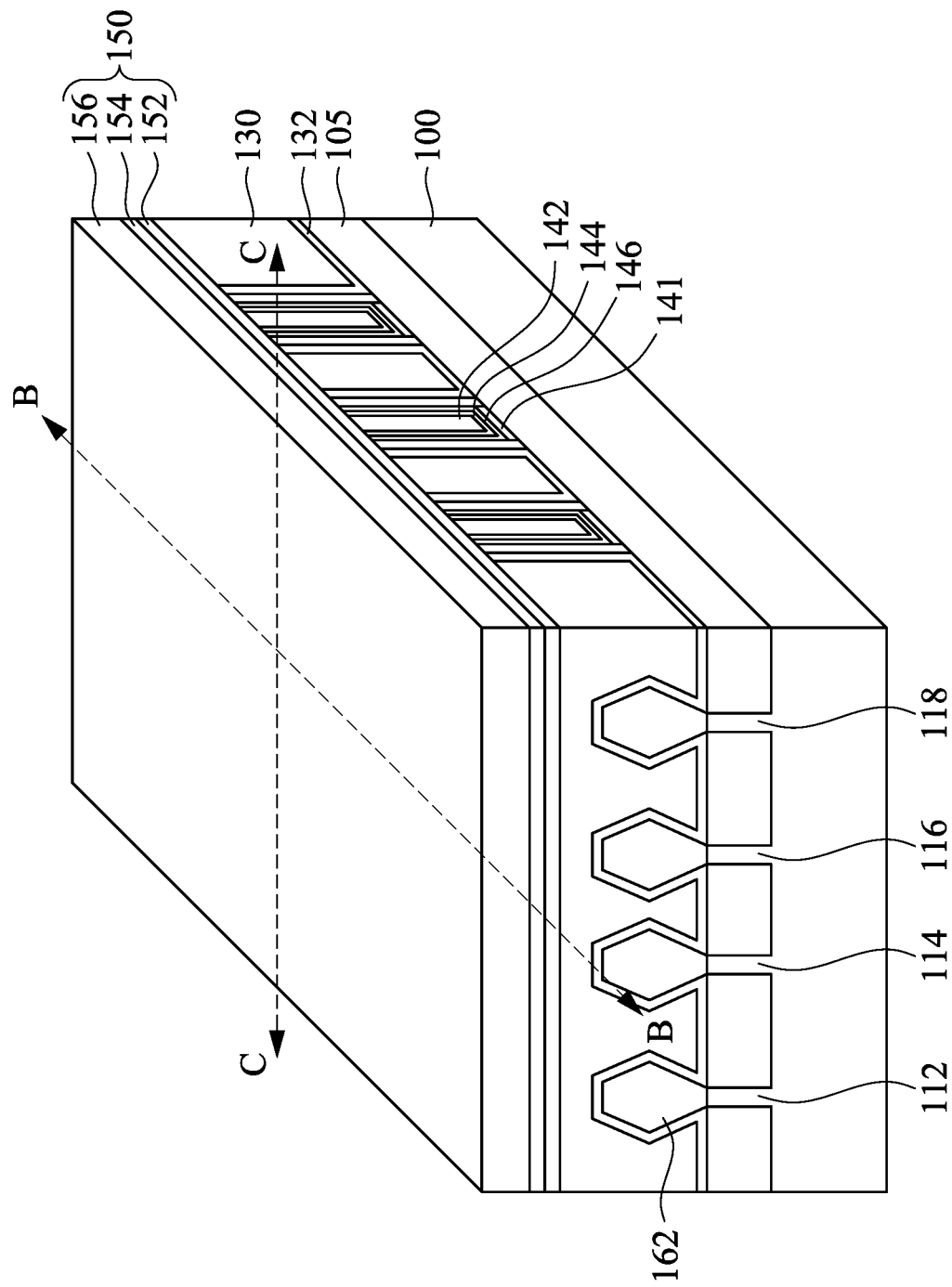
Figure 7B:
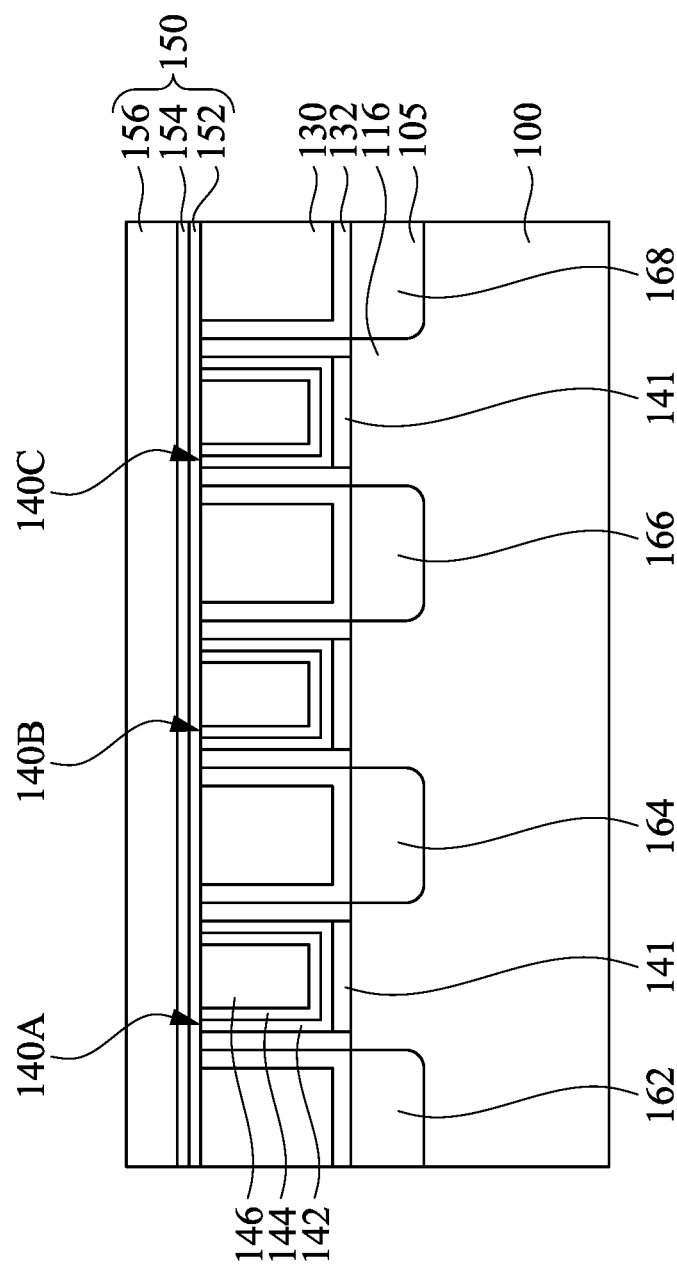
Figure 7C:
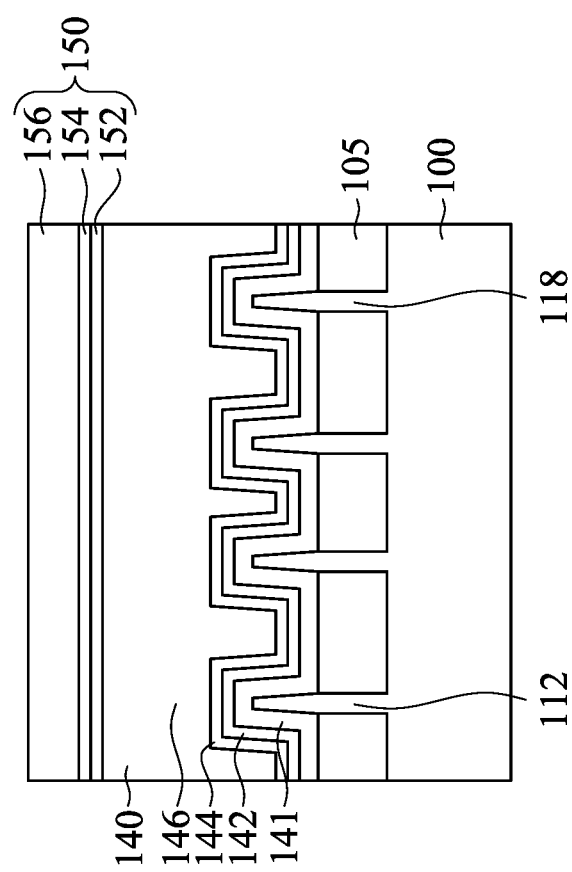

Reference is made to FIGS. 7A to 7C, in which FIG. 7B is a cross-sectional view along line B-B of FIG. 7A, and FIG. 7C is a cross-sectional view along line C-C of FIG. 7A. A hard mask 150 is formed over the ILD layer 130 and covering the metal gate structures 140A, 140B, and 140C. In some embodiments, the hard mask 150 may include a first hard mask layer 152, a second hard mask layer 154, and a third hard mask layer 156.

In some embodiments, the first hard mask layer 152 may be made of a dielectric material, such as SiN, $SiO_2$, the like, or combinations thereof. The first hard mask layer 152 may be formed using a deposition method such as atomic layer deposition (ALD), plasma enhanced chemical vapor deposition (PECVD), chemical vapor deposition (CVD), or the like. However, any suitable materials and any suitable methods may be used to form the first hard mask layer 152.

In some embodiments, the second hard mask layer 154 may be made of silicon, and thus can also be referred to as a semiconductor layer. The second hard mask layer 154 may be formed using a deposition method such as atomic layer deposition (ALD), plasma enhanced chemical vapor deposition (PECVD), chemical vapor deposition (CVD), or the like. However, any suitable materials and any suitable methods may be used to form the second hard mask Layer 154.

In some embodiments, the third hard mask layer 156 may be made of a dielectric material, such as SiN, SiO$_2$, the like, or combinations thereof. The third hard mask layer 156 may be formed using a deposition method such as atomic layer deposition (ALD), plasma enhanced chemical vapor deposition (PECVD), chemical vapor deposition (CVD), or the like. However, any suitable materials and any suitable methods may be used to form the third hard mask layer 156. In some embodiments, the first hard mask layer 152 and the third hard mask layer 156 may be made of a same material that is different from a material of the second hard mask layer 154. In some embodiments, the third hard mask layer 156 may be thicker than the first hard mask layer 152 and the second hard mask layer 154.

Figure 8A:
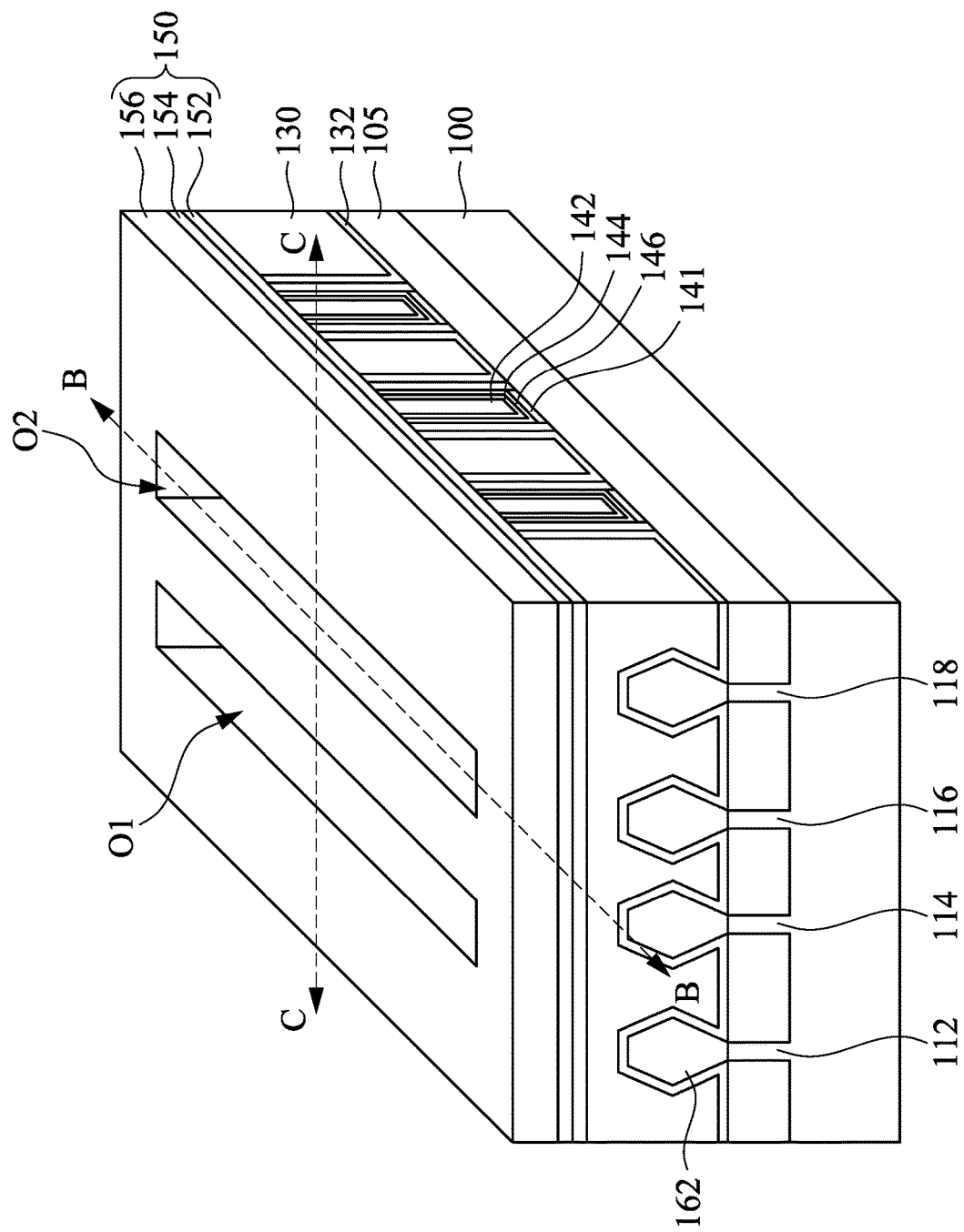
Figure 8B:
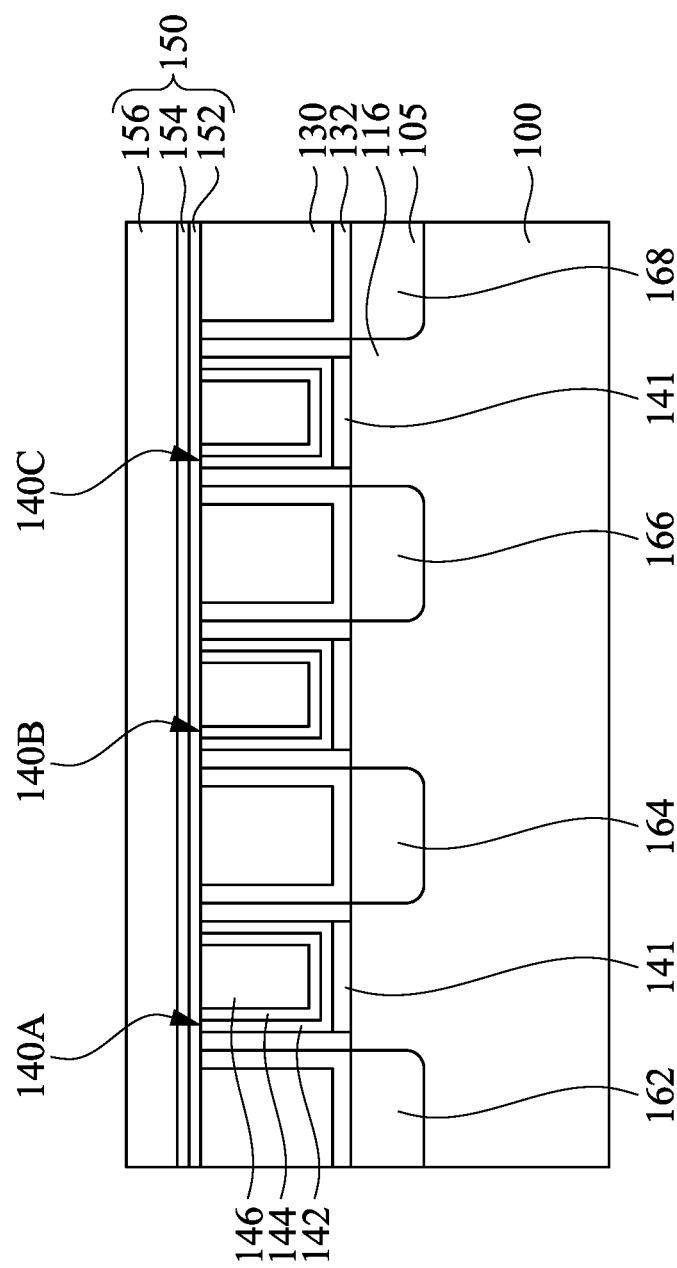
Figure 8C:
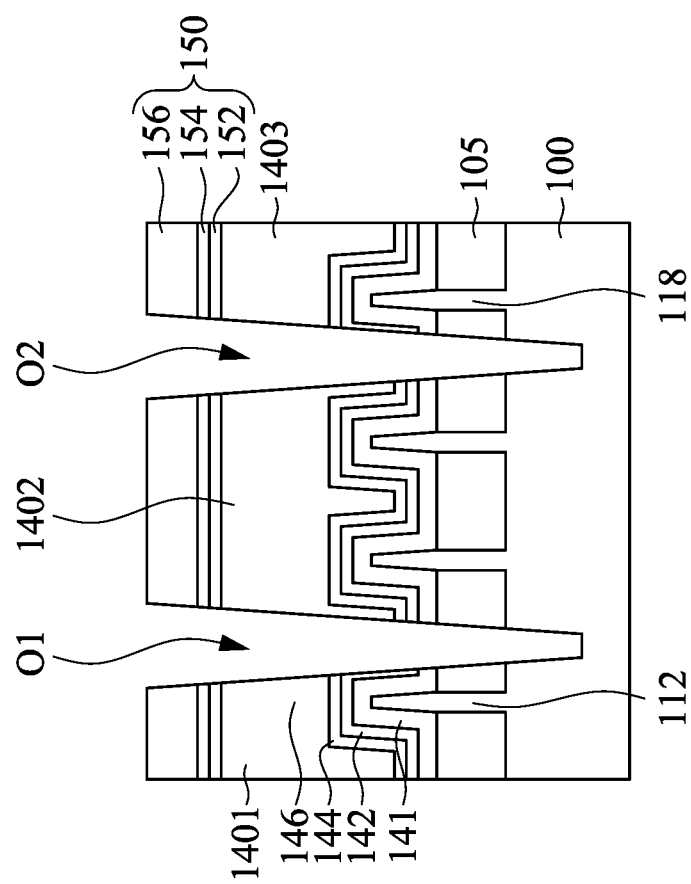

Reference is made to FIGS. 8A to 8C, in which FIG. 8B is a cross-sectional view along line B-B of FIG. 8A, and FIG. 8C is a cross-sectional view along line C-C of FIG. 8A. Openings O1 and O2 are formed in the hard mask 150 to expose portions of the metal gate structures 140A, 140B, 140C. Afterwards, an etching process is performed to remove the exposed portions of the metal gate structures 140A, 140B, 140C through the openings O1 and O2, so to as cut each of the metal gate structures 140A, 140B, and 140C into individual and separated portions. For example, as shown in the cross-sectional view of FIG. 8C, which is taken along the lengthwise direction of the metal gate structure 140B, the metal gate structure 140B is cut into individual portions 1401, 1402, and 1403, in which the portion 1402 is laterally between adjacent openings O1. In some embodiments, the openings O1 and O2 may also be referred to as cut-metal-gate (CMG) openings. It is noted that although the cross-sectional view of FIG. 8C is taken along the lengthwise direction of the metal gate structure 140B, the openings O1 and O2 may include similar relationship with the metal gate structures 140A and 140C.

In some embodiments, the etching process may also remove portions of the isolation structures 105 and the substrate 100, such that the bottommost end of each of the openings O1 and O2 may extend to a position lower than the top surface of the substrate 100. Stated another way, the bottommost end of each of the openings O1 and O2 may extend to a position lower than the bottom surfaces of the isolation structures 105.

Figure 9A:
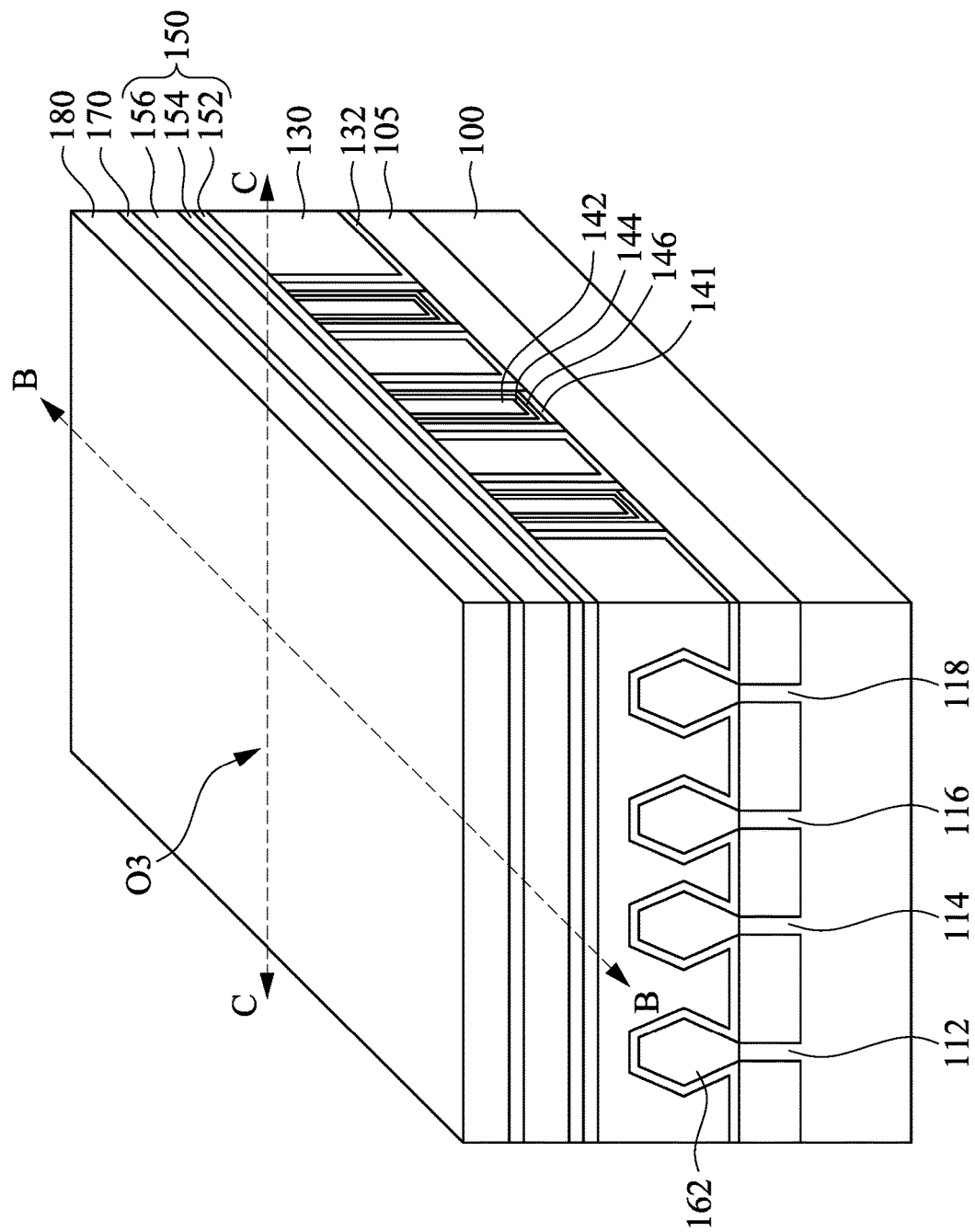
Figure 9B:
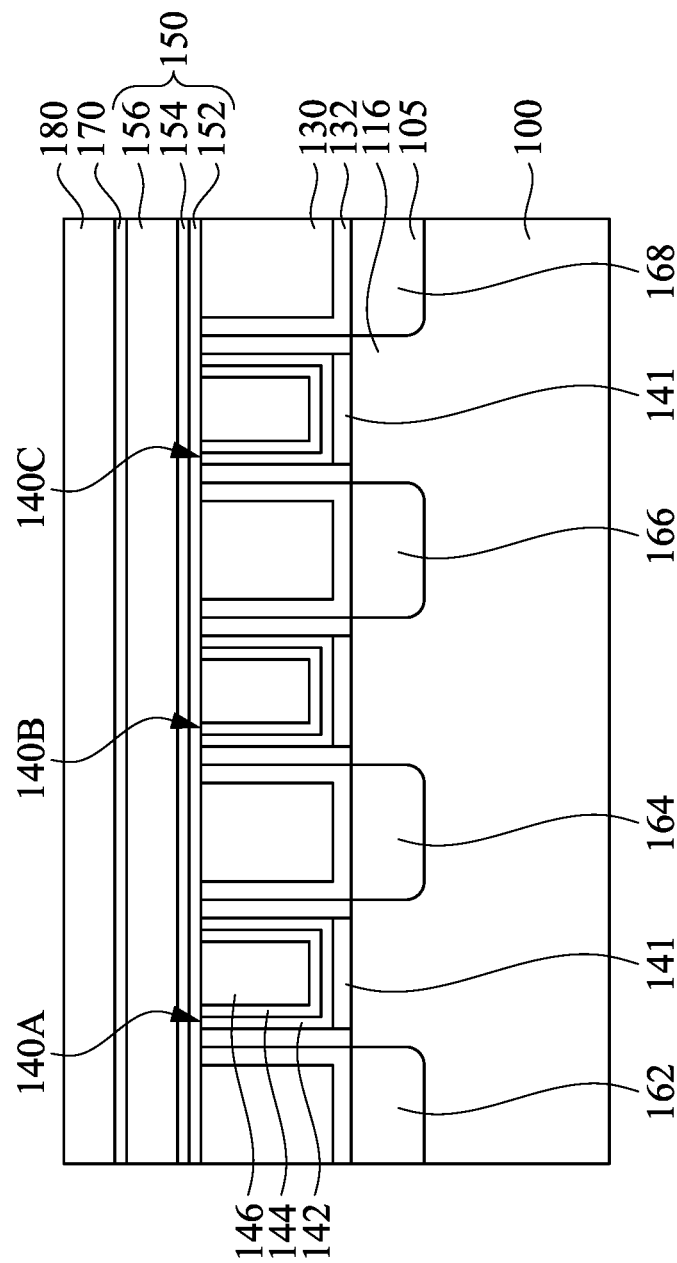
Figure 9C:
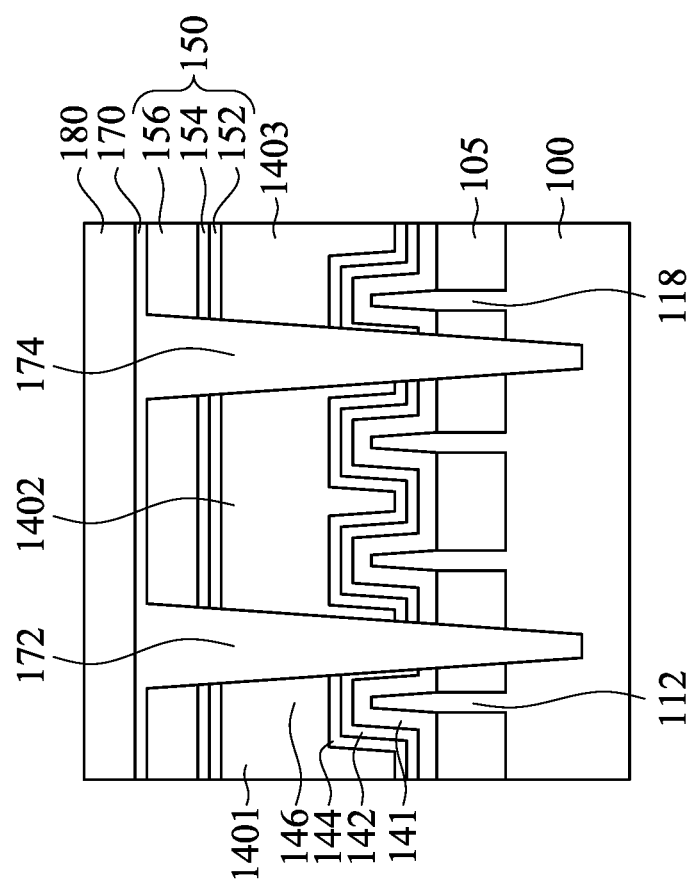

Reference is made to FIGS. 9A to 9C, in which FIG. 9B is a cross-sectional view along line B-B of FIG. 9A, and FIG. 9C is a cross-sectional view along line C-C of FIG. 9A. A dielectric layer 170 is deposited over the substrate 100 and over filling the openings O1 and O2. In some embodiments, the dielectric layer 170 has portions 172 and 174 filled in the openings O1 and O2, and the portions 172 and 174 can be also referred to as isolation structures (or dielectric structures) 172 and 174.

In some embodiments, the dielectric layer 170 may include silicon nitride. In some other embodiments, the dielectric layer 170 may include oxide. The dielectric layer 170 may be deposited using CVD, PVD, ALD, or other suitable methods. For example, the dielectric layer 170 may be a flowable dielectric material that can be deposited into the openings O1 and O2 using a flowable CVD (FCVD).

As shown in the cross-sectional view of FIG. 9B, the isolation structures 172 and 174 are disposed on opposite sides of the portion 140B-2 of the metal gate structures 140B. In some embodiments, the bottom surfaces of the isolation structures 172 and 174 are lower than the top surface of the substrate 100. Stated another way, the bottom surfaces of the isolation structures 172 and 174 are lower than the bottom surfaces of the isolation structures 105.

Moreover, the isolation structures 172 and 174 may be in contact with the gate dielectric layer 142, the work function metal layer 144, and the gate electrode 146 of the metal gate structure 140B (and the metal gate structures 140A and 140C). It is noted that although the cross-sectional view of FIG. 9C is taken along the lengthwise direction of the metal gate structure 140B, the isolation structures 172 and 174 may include similar relationship with the metal gate structures 140A and 140C.

After the dielectric layer 170 is formed, a hard mask 180 is formed over the dielectric layer 170. In some embodiments, the dielectric layer 170 may include a portion spanning over top surface of the hard mask 150, and thus the hard mask 180 may be vertically separated from the hard mask 150 by the dielectric layer 170.

The hard mask 180 may be made of a dielectric material, such as SiN, SiO$_2$, the like, or combinations thereof. The hard mask 180 may be formed using a deposition method such as atomic layer deposition (ALD), plasma enhanced chemical vapor deposition (PECVD), chemical vapor deposition (CVD), or the like. However, any suitable materials and any suitable methods may be used to form the hard mask 180. In some embodiments, the hard mask 180 and the first and third hard mask layers 152 and 156 may be made of a same material that is different from a material of the second hard mask layer 154.

Figure 10A:
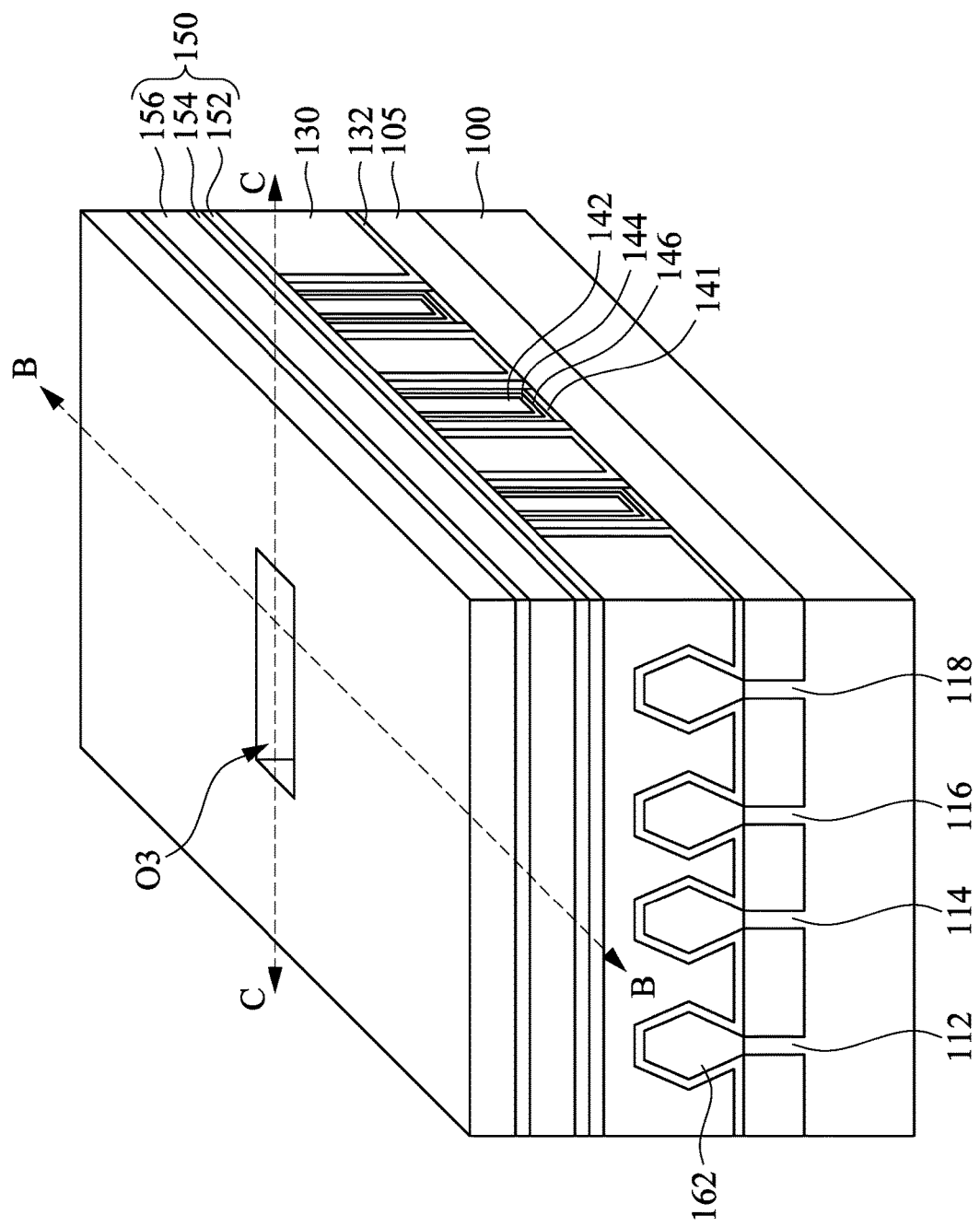
Figure 10B:
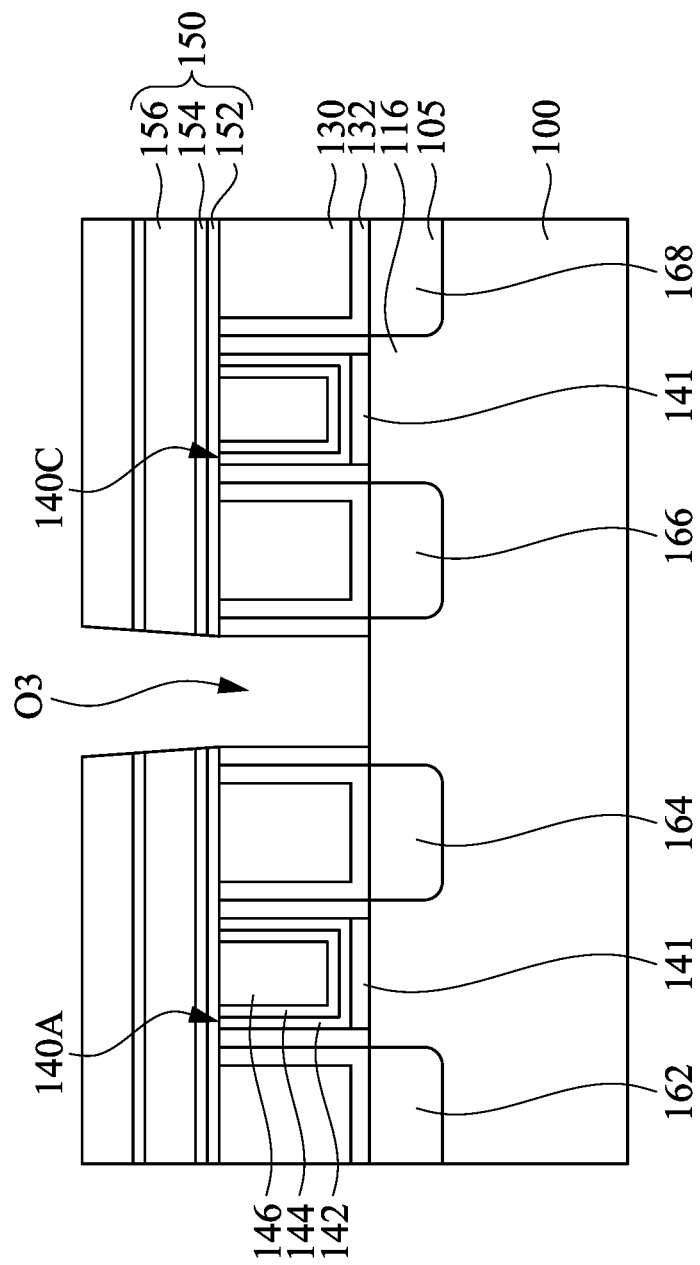
Figure 10C:
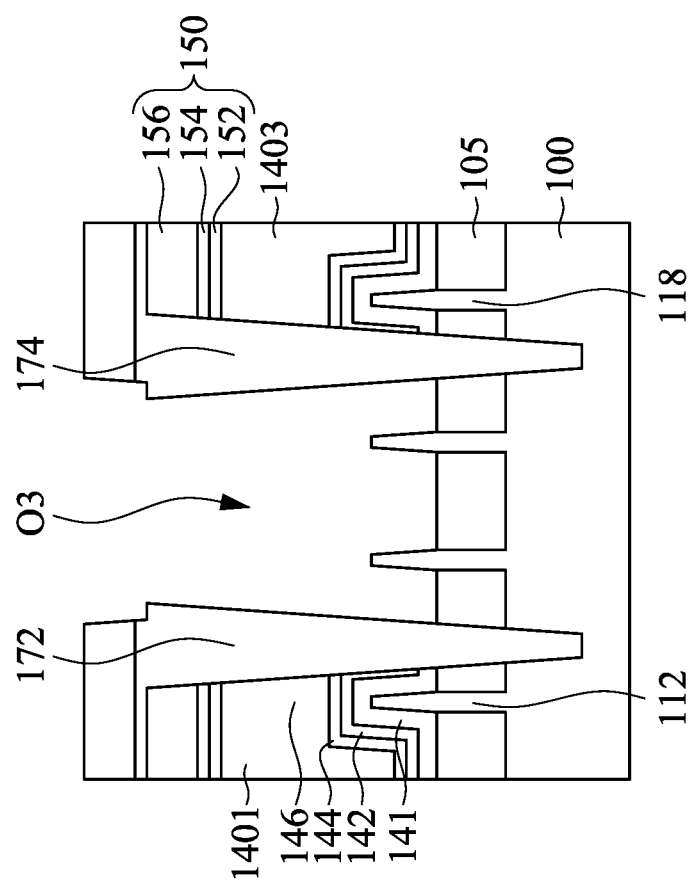

Reference is made to FIGS. 10A to 10C, in which FIG. 10B is a cross-sectional view along line B-B of FIG. 10A, and FIG. 10C is a cross-sectional view along line C-C of FIG. 10A. An opening O3 is formed through the hard mask 180, the dielectric layer 170, the hard mask 150, and the metal gate structure 140B via an etching process. For example, a patterned mask, such as a photoresist, is formed over the hard mask 180, in which the opening may be vertically aligned with the portion 1402 of the metal gate structure 140B (see FIG. 9C). However, the patterned mask may protect the metal gate structures 140A and 140C. Afterward, an etching process may be performed to the hard mask 180, the dielectric layer 170, the hard mask 150, and the metal gate structure 140B through the opening of the patterned mask to form the opening O3. In greater details, portion 1402 of the metal gate structure 140B is removed by the etching process, while leaving the metal gate structures 140A and 140C, and portions 1401 and 1403 of the metal gate structure 140B substantially intact after the etching process. Stated another way, during removing the portion 1402 of the metal gate structure 140B, the metal gate structures 140A and 140C, and portions 1401 and 1403 of the metal gate structure 140B are protected.

In the cross-sectional view of FIG. 10B, the opening O3 is formed between the pair of the gate spacers 125B. Although not shown, it is understood that the gate spacers 125B may remain in contact with opposite sidewalls of the remaining portions 1401 and 1403 of the metal gate structure 140B.

In the cross-sectional view of FIG. 10C, the opening O3 is formed between the isolation structures 172 and 174, and may expose at least a sidewall of each of the isolation structures 172 and 174. However, another sidewall of each of the isolation structures 172 and 174 may still be covered by the remaining metal gate structure 140B. Moreover, the opening O3 may expose the semiconductor fins 114 and 116 and portions of the isolation structures 105, while the semiconductor fins 114 and 116 may be protected by the portions 1401 and 1403 of the metal gate structures 140B.

Figure 11A:
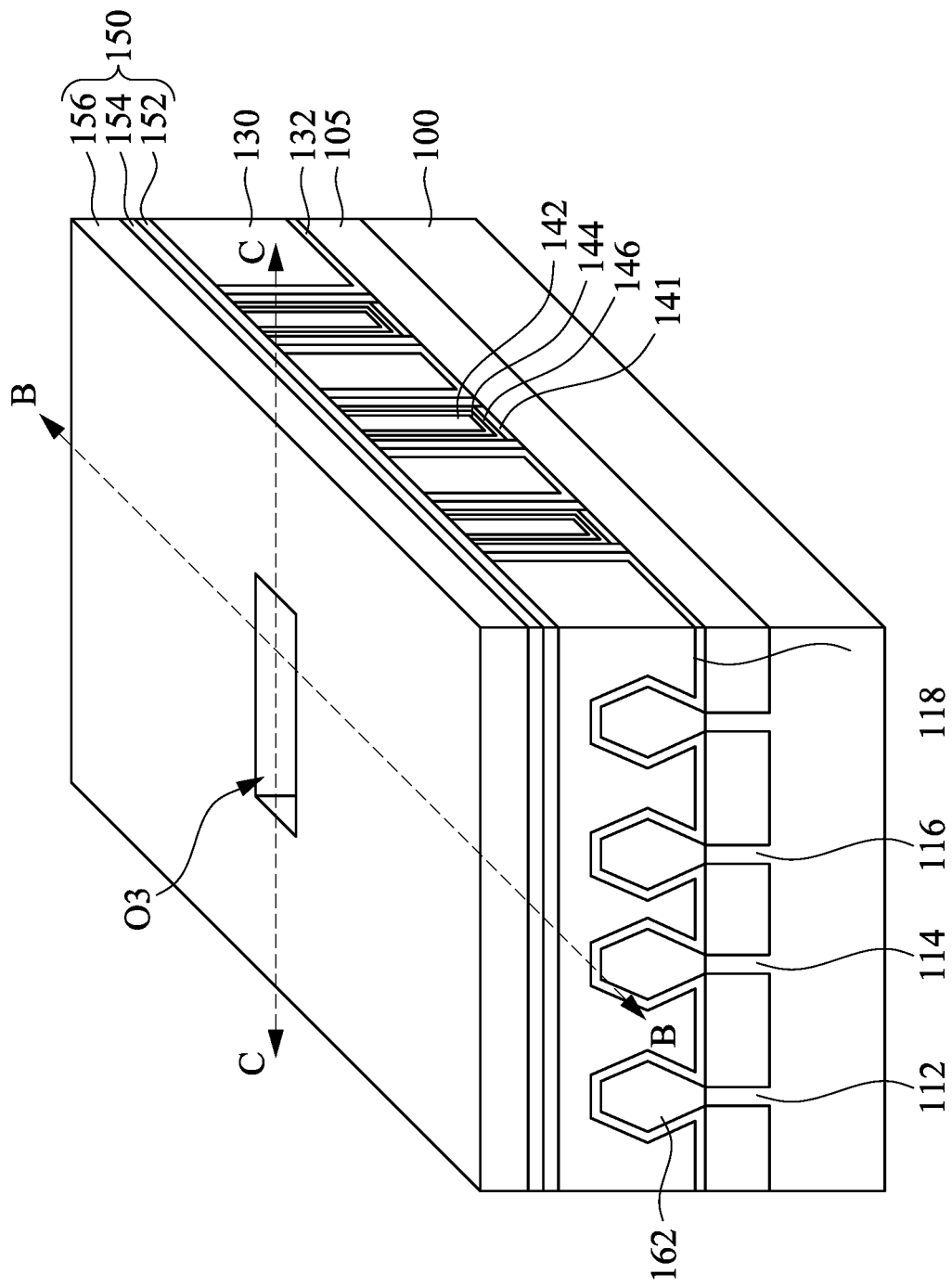
Figure 11B:
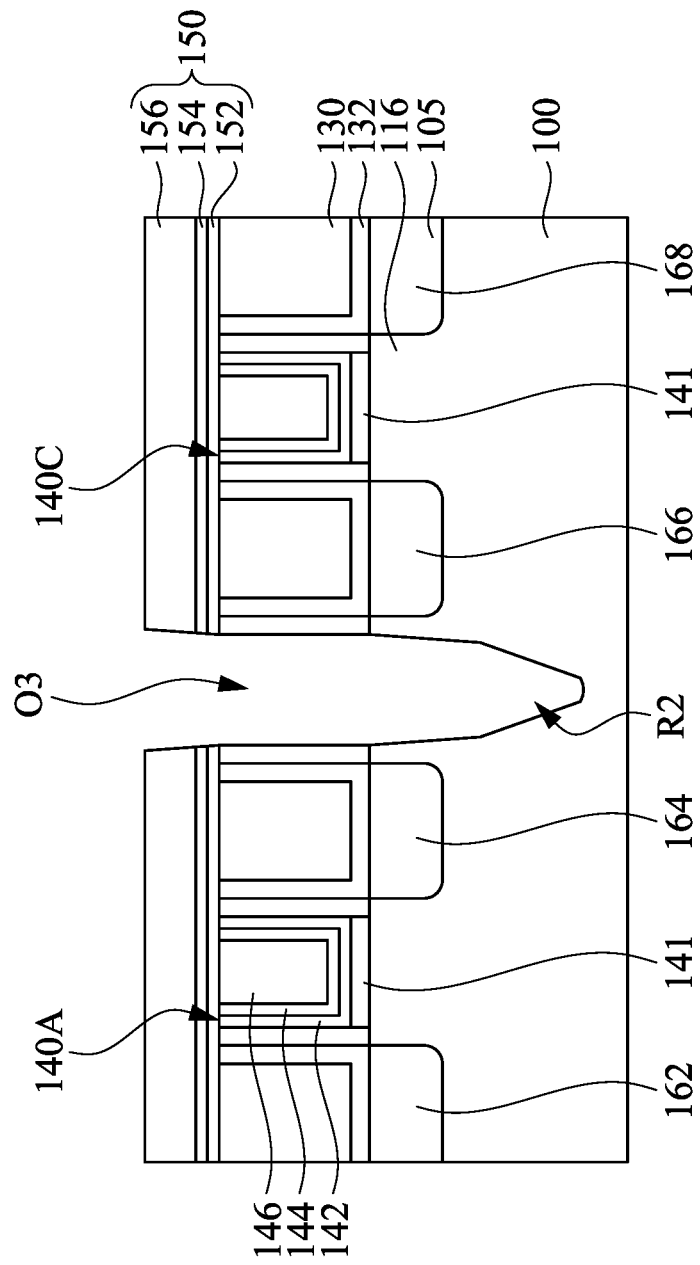
Figure 11C:
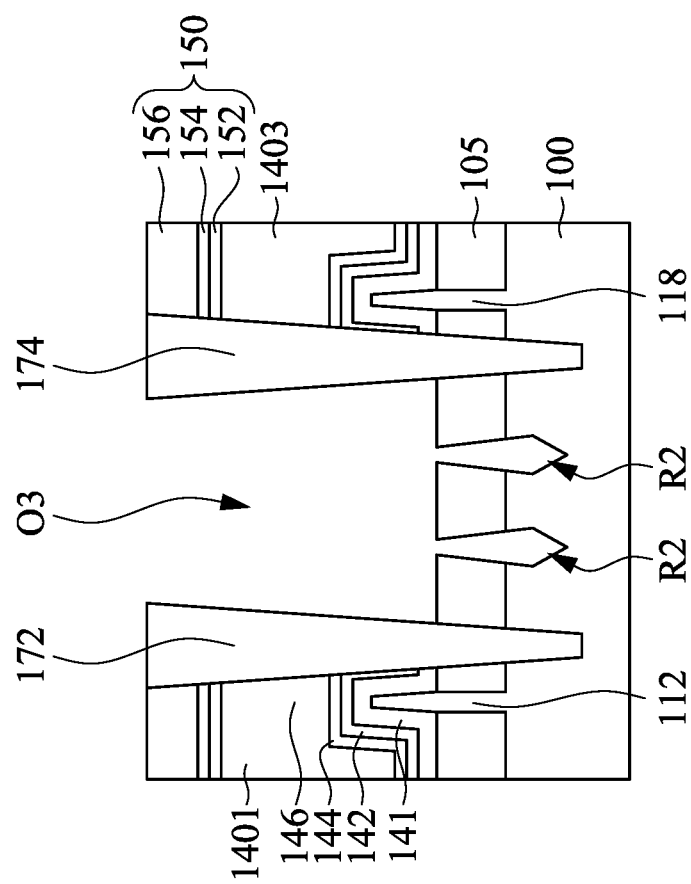

Reference is made to FIGS. 11A to 11C, in which FIG. 11B is a cross-sectional view along line B-B of FIG. 11A, and FIG. 11C is a cross-sectional view along line C-C of FIG. 11A. An etching process is performed through the opening O3 to remove portions of the semiconductor fins 114 and 116, so as to form recesses R2 in the semiconductor fins 114 and 116. In some embodiments, during the etching process of etching the semiconductor fins 114 and 116, the hard mask 180 and portions of the dielectric layer 170 may be removed, and the hard mask 150 may be exposed.

As shown in the cross-sectional view of FIG. 11B, a recess R2 is formed in the semiconductor fin 116. Moreover, a width of the recess R2 may decreases as a distance to the substrate 100 decreases. That is, in the cross-sectional view of FIG. 11B, an entirety of the recess R2 may taper toward the substrate 100. Although the cross-sectional view of FIG. 11B is taken along the semiconductor fin 116, it is understood that the semiconductor fin 114 and the recess R2 may include similar relationship as described in FIG. 11B.

As shown in in the cross-sectional view of FIG. 11C, the recesses R2 is formed within the isolation structures 105, and bottommost end of each recess R2 is in the substrate 100. That is, the bottommost end of each recess R2 may be below the top surface of the substrate 100, or may be below the bottom surfaces of the isolation structures 105. Moreover, a top portion of the recess R2 has a width increasing as a distance to the substrate 100 decreases, and a bottom portion of the recess R2 has a width decreases as a distance to the substrate 100 decreases.

Figure 12A:
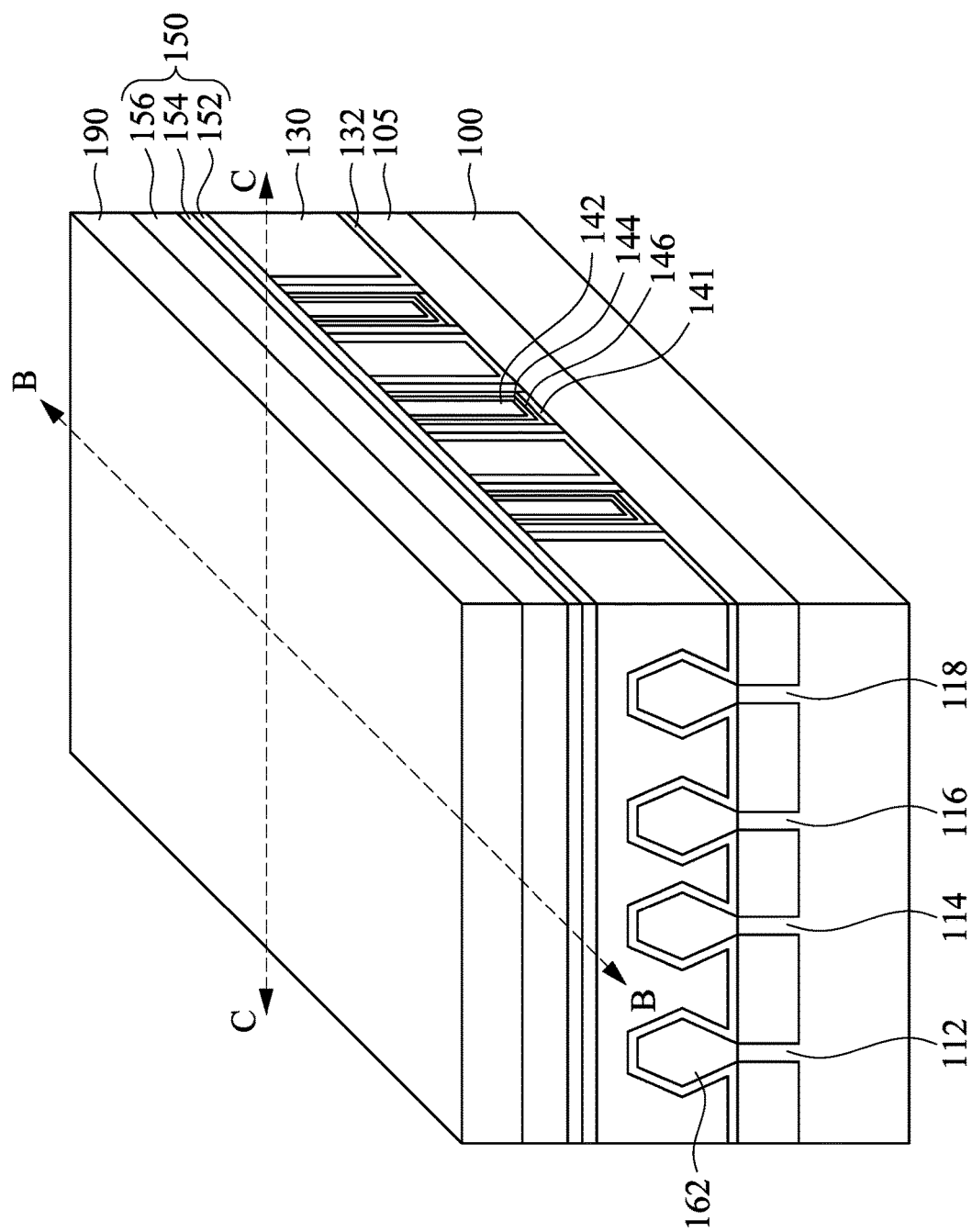
Figure 12B:
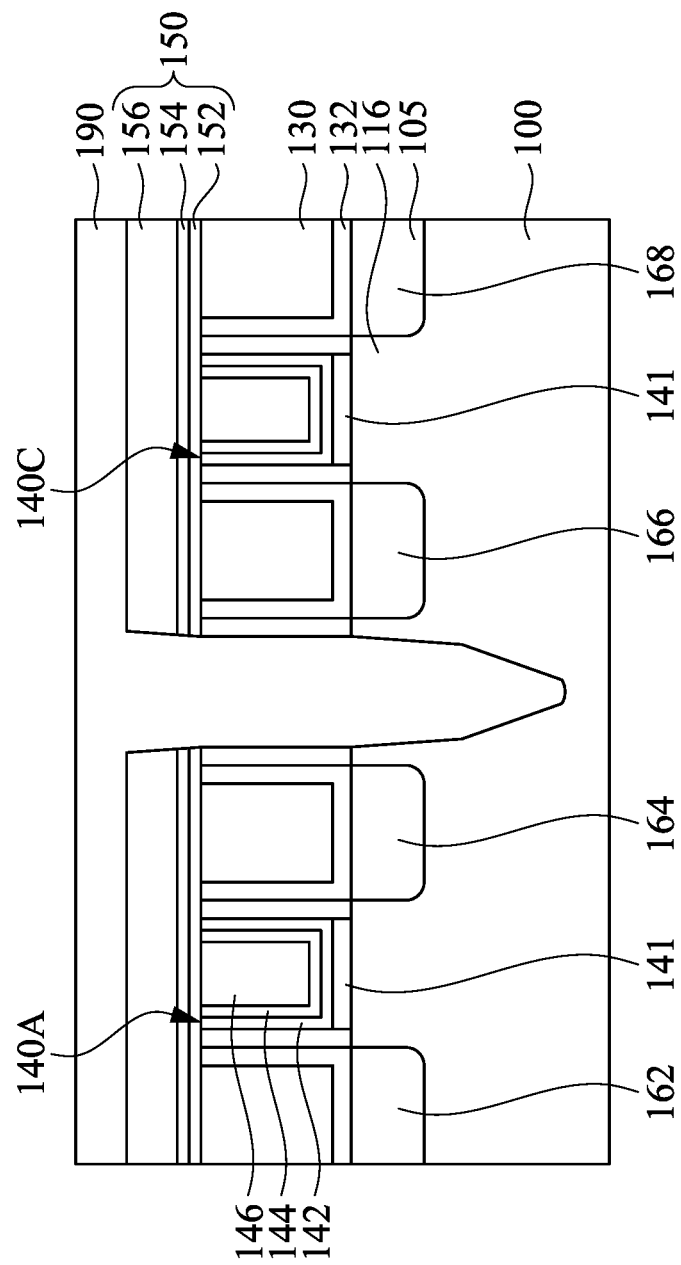
Figure 12C:
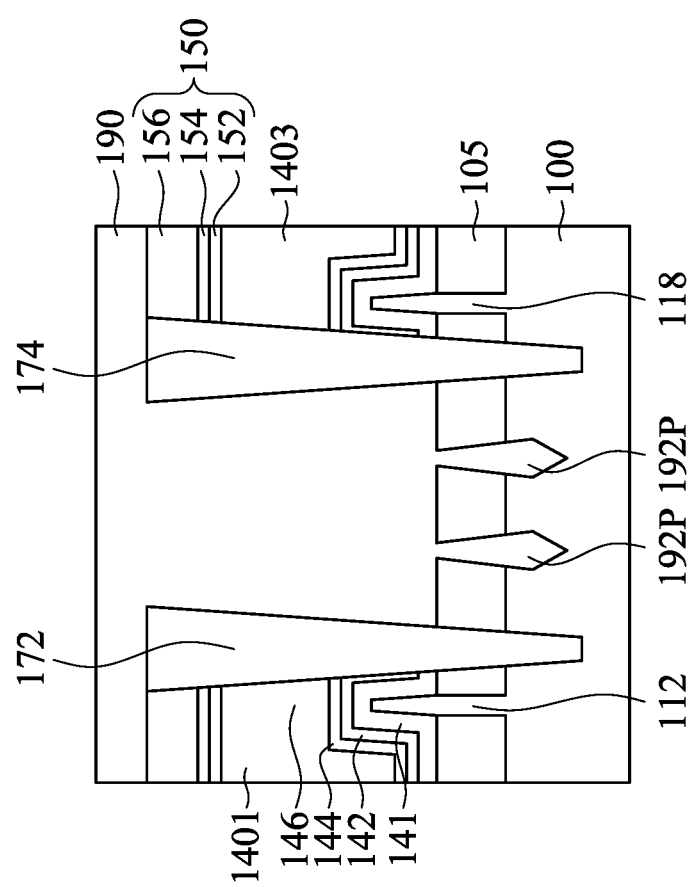

Reference is made to FIGS. 12A to 12C, in which FIG. 12B is a cross-sectional view along line B-B of FIG. 12A, and FIG. 12C is a cross-sectional view along line C-C of FIG. 12A. A dielectric layer 190 is deposited over the substrate 100 and filling the recesses R2 and the opening O3. The dielectric layer 190 may overfill the opening O3 and may be in contact with top surfaces of the isolation structures 172, 174, and the hard mask 150.

In some embodiments, the dielectric layer 190 may be made of boron nitride (BN), and thus can also be referred to as BN layer. In some embodiments, the dielectric layer 190 may include amorphous structure, and can also be referred to as amorphous BN (a-BN). In some embodiments, the ratio of boron atoms (B) to nitrogen atoms (N) is in a range from about 0.9 to about 1.1. The BN layer 190 may be doped with hydrogen (H), and can also be referred to as BN:H layer. The atomic concentration of hydrogen in the BN layer is in a range from about 1% to about 7% (e.g., 5.5%). In some embodiments, the BN layer 190 has a dielectric constant in a range from about 2 to about 4. In some embodiments, the dielectric constant of the BN layer 190 may be lower than dielectric constants of silicon oxide and silicon nitride. In some embodiments, breakdown voltage of a-BN could be greater than 6 MV/cm at current=$1e_{-3}$ A/cm$_2$, and k<6, which are better than SiN$_x$:H. Also, the leakage of a-BN at 2 MV/cm is <$1e_{-7}$ A/cm$_2$.

In some embodiments, the dielectric layer 190 may be deposited using atomic layer deposition (ALD) process. Because the boron precursor is small and light, the high diffusion coefficient of boron precursor (such as B$_2$H$_6$, BNH$_6$) lead good conformal soak in opening O3 and recesses R2 during the ALD process.

In an ALD process, a thin film of the dielectric layer 190 is slowly deposited through repeated exposure to first and second precursors. In some embodiments, the first precursor may be boron source, such as such as B$_2$H$_6$, BNH$_6$, or the like. In some embodiments, the second precursor may be nitrogen source. For example, the second precursor may include Ar and N$_2$. The second precursor may also include N$_2$ and H$_2$. The second precursor may also include Ammonia (NH$_3$) with H$_2$. The second precursor may also include Ar, He, N$_2$. In some embodiments, plasma treatment may be performed during the ALD process, because plasma treatment is helpful to remove —H ligand and can avoid precursor soak.

Figure 13A:
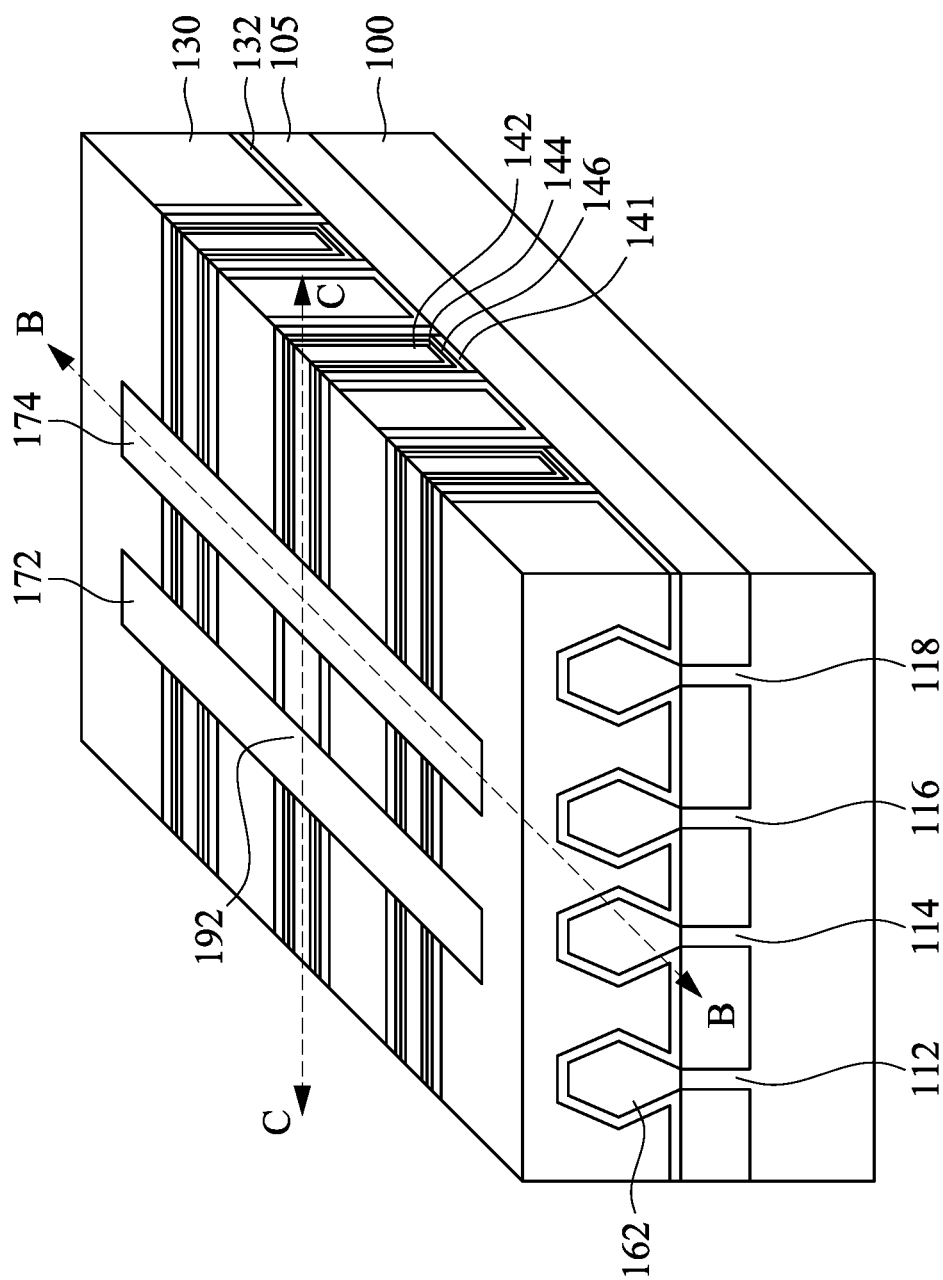
Figure 13B:
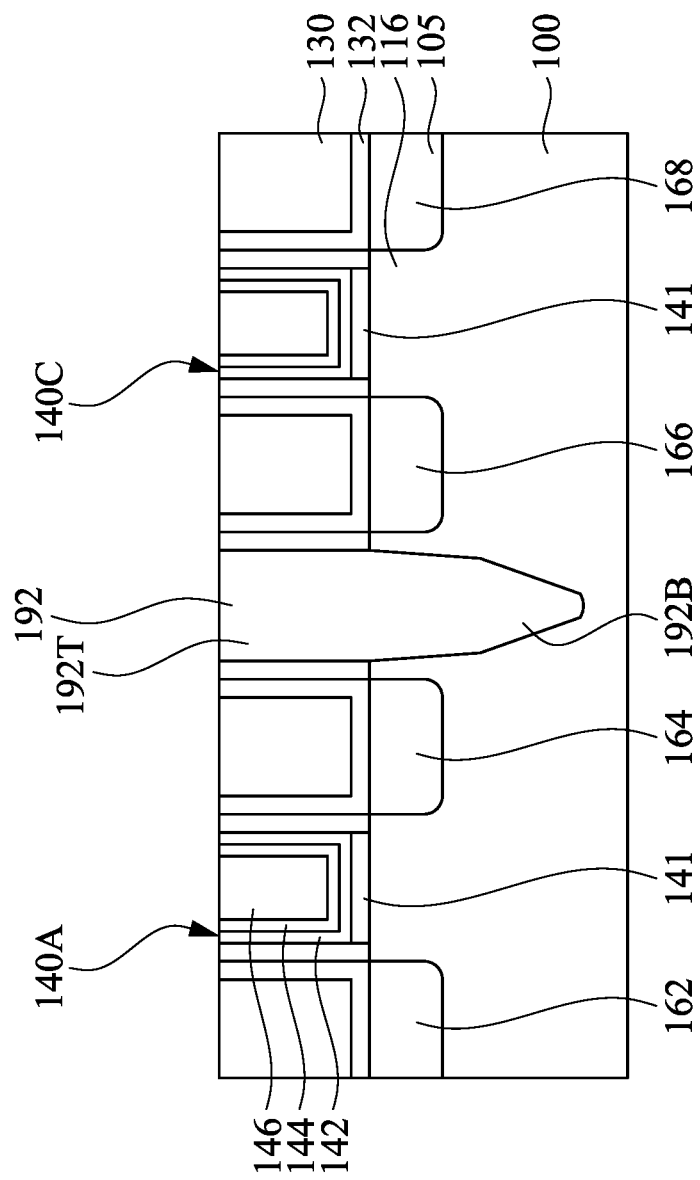
Figure 13C:
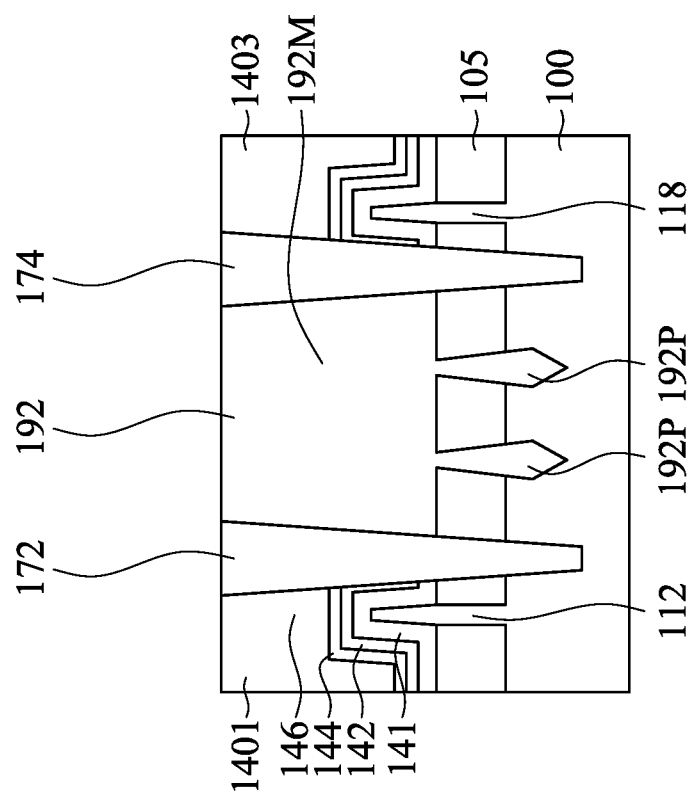

Reference is made to FIGS. 13A to 13C, in which FIG. 13B is a cross-sectional view along line B-B of FIG. 13A, and FIG. 13C is a cross-sectional view along line C-C of FIG. 13A. A chemical mechanical polish (CMP) is performed to remove excess dielectric layer 190 until top surfaces of the ILD layer 130, the isolation structures 172, 174, and the metal gate structures 140A to 140C are exposed. The remaining dielectric layer 190 is referred to as isolation structure 192. In some embodiments, after the CMP process, top surfaces of the isolation structure 172, 174, and 192 are substantially level with top surfaces of the metal gate structures 140A to 140C, and are e substantially level with top surfaces of the ILD layer 130 and the CESL 132.

As shown in FIG. 13A, the length wise direction of the isolation structure 192 is perpendicular to the length wise direction of the isolation structures 172 and 174. For example, the lengthwise direction of the isolation structure 192 is parallel to the lengthwise direction of the metal gate structures 140A to 140C. However, the lengthwise direction of the isolation structures 172 and 174 is parallel to the lengthwise direction of the semiconductor fins 112 to 118.

As shown in FIG. 13B, the isolation structure 192 has a top portion between the gate spacers 125B. The top portion 192T of the isolation structure 192 in the cross-sectional view of FIG. 13B may include substantially a uniform width. The isolation structure 192 also includes a bottom portion 192B in the semiconductor fin 116, and the bottom portion 192B may laterally separates the epitaxial source/drain structure 164 from the epitaxial source/drain structure 166. The bottom portion 192B of the isolation structure 192 in the cross-sectional view of FIG. 13B may include a tapered profile. For example, the bottom portion 192B of the isolation structure 192 may taper toward the substrate 100. Stated another way, a width of the bottom portion 192B of the isolation structure 192 may decrease as a distance to the substrate IOU decreases.

As shown in FIG. 13C, the isolation structure 192 is laterally between the isolation structures 172 and 174, and may be in contact with the isolation structures 172 and 174. The isolation structure 192 has a main portion 192M in contact with the isolation structures 172 and 174. The isolation structure 192 further includes two protrusion portions 192P protruding from bottom surface of the main portion 192M, in which the protrusion portions 192P are embedded in the isolation structures 105 and the substrate 100.

The main portion 192M has a tapered profile. For example, the main portion 192M may taper away from the substrate 100. Stated another way, a width of the main portion 192M of the isolation structure 192 may decrease as a distance to the substrate 100 increases. That is, the widest width of the main portion 192M is at the top surface of the main portion 192M.

Each of the protrusion portions 192P may include an upper portion and a lower portion, in which the upper portion may taper away from the substrate 100, and the lower portion may taper toward the substrate 100. Stated another way, a width of the upper portion of the protrusion portion 192P decreases as a distance to the substrate 100 increases, and a width of the lower portion of the protrusion portion 192P decreases as a distance to the substrate 100 decreases. That is, a width of the protrusion portion 192P increases from a top level to an intermediate level in the protrusion portion 192P and then decreases from the intermediate level to a bottom level of the protruding portion 192P. In some embodiments, the widest width of the protrusion portion 192P is below the top surface of the substrate 100.

The isolation structures 172 and 174 have tapered profile. For example, the isolation structures 172 and 174 may taper toward the substrate 100. Stated another way, a width of the isolation structures 172 and 174 may decrease as a distance to the substrate 100 decreases. That is, the widest width of the isolation structures 172 and 174 is at the top surfaces of the isolation structures 172 and 174.

In some embodiments, the isolation structure 192 may be formed of a different material than the isolation structures 172 and 174. As mentioned above, the isolation structure 192 may be made of a boron-containing material, while the isolation structures 172 and 174 may be made of a boron-free material. In some embodiments, the isolation structure 192 may be made of boron nitride, while the isolation structures 172 and 174 may be made of a silicon-based material, such as silicon nitride or silicon oxide. In some embodiments, the isolation structure 192 has a dielectric constant lower than the dielectric constant of the isolation structures 172 and 174. For example, the dielectric constant of the isolation structure 192 is in a range from about 2 to about 4, while the dielectric constant of the isolation structures 172 and 174 is in a range from about 6 to about 7.5. In some embodiments, the dielectric constant of the isolation structure 192 may also be lower than the dielectric constant of the isolation structures 105. In some embodiments, the dielectric constant of the isolation structure 192 may also be lower than the dielectric constant of the gate spacers 125A, 125B, and 125C.

Figure 14A:
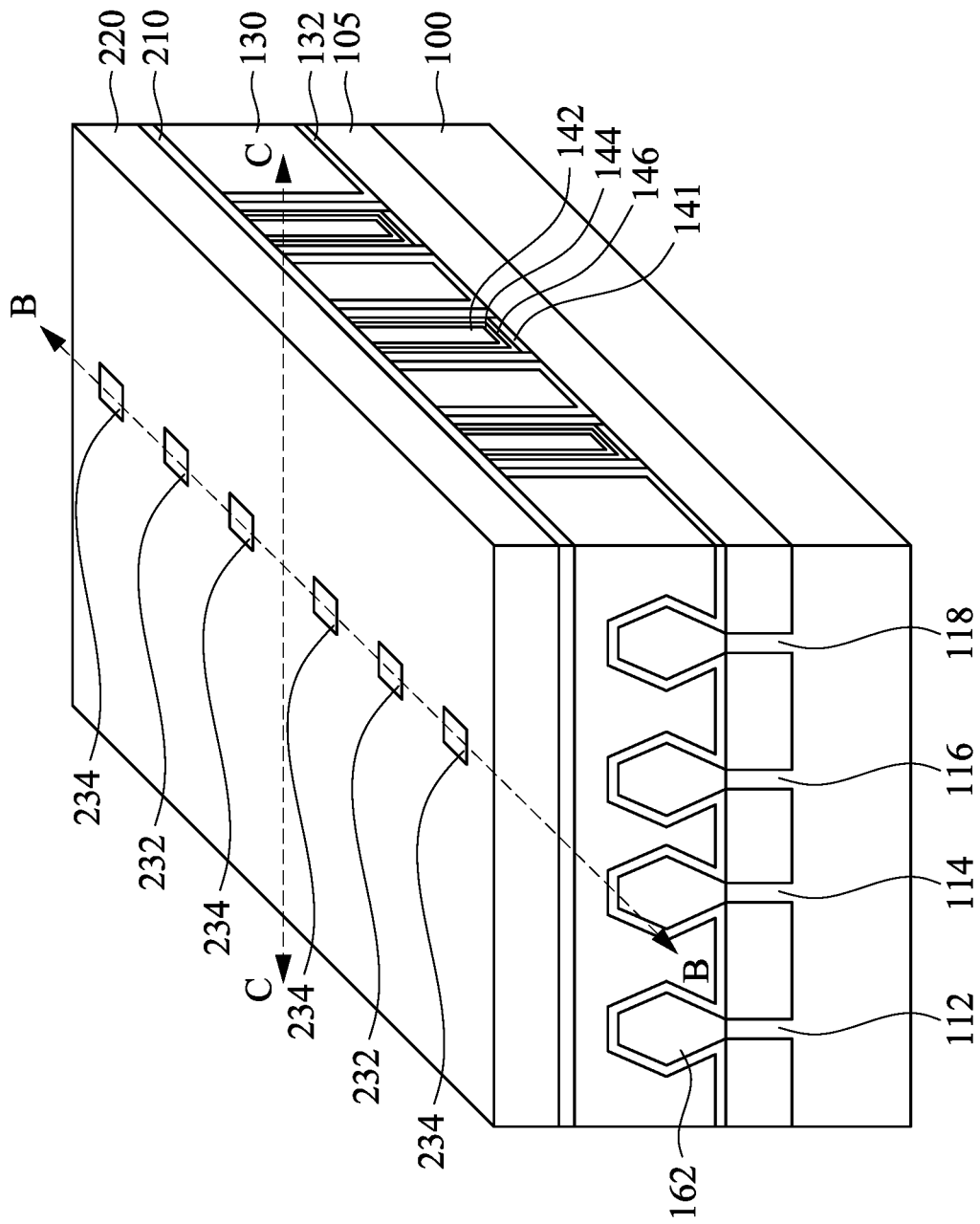
Figure 14B:
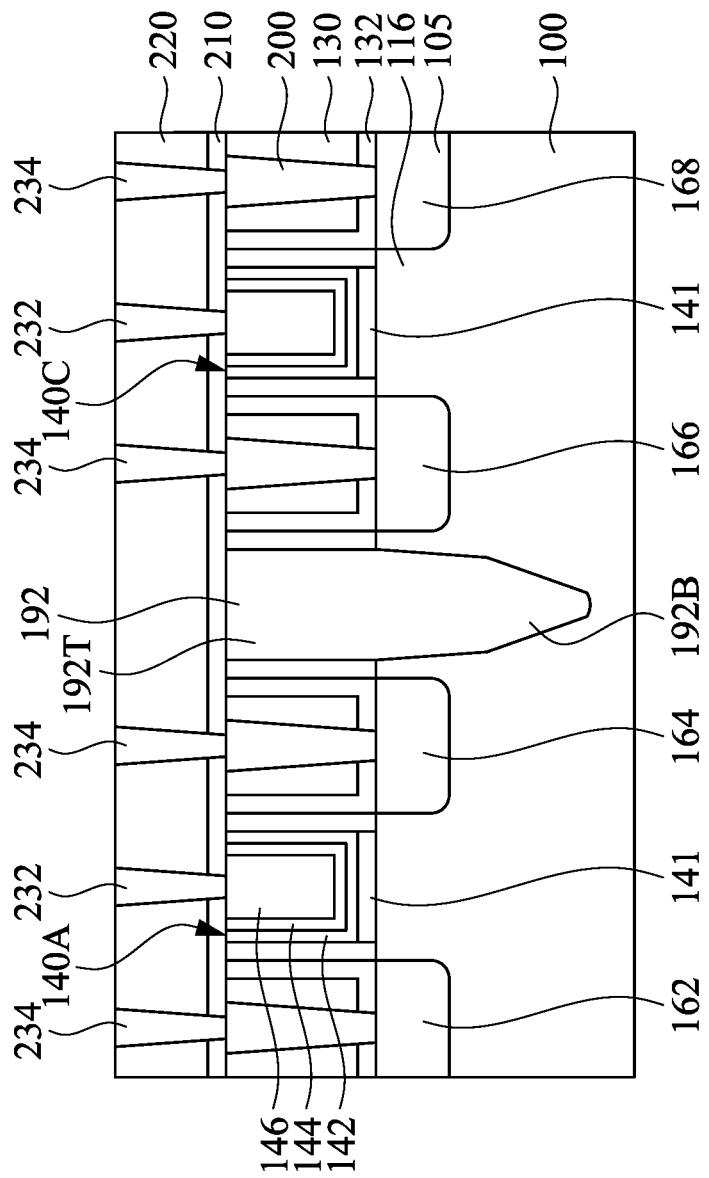
Figure 14C:
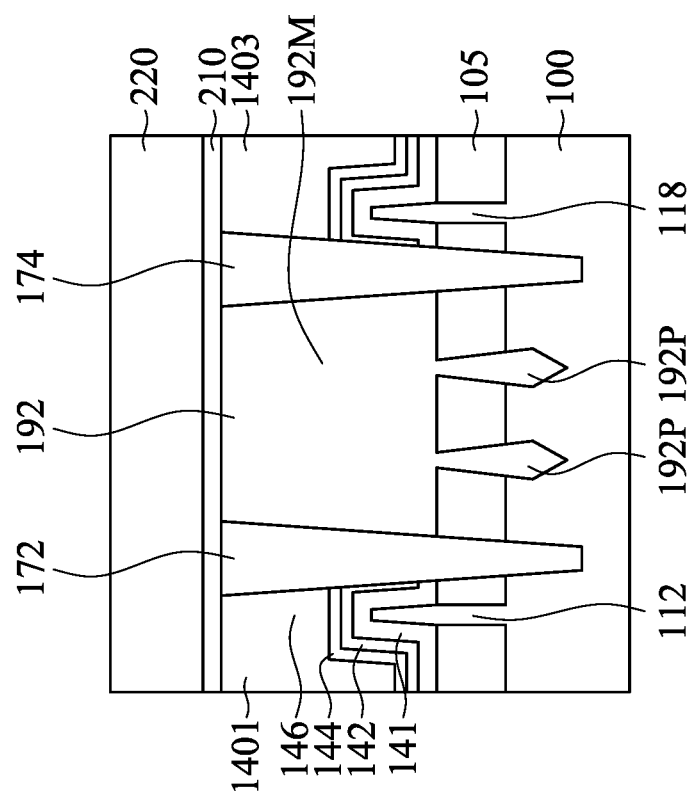

Reference is made to FIGS. 14A to 14C, in which FIG. 14B is a cross-sectional view along line B-B of FIG. 14A, and FIG. 14C is a cross-sectional view along line C-C of FIG. 14A. Source/drain contacts 200 are formed in the ILD layer 130 and the CESL 132. In some embodiments, the source/drain contacts 200 may be formed by, for example, patterning the ILD layer 130 and the CESL 132 to form source/drain openings that expose the epitaxial source/drain structures 162 to 168, depositing a conductive material in the source/drain openings, and performing a CMP process to remove excess conductive material until top surface of the ILD layer 130 is exposed. In some embodiments, the conductive material includes one or more layers of Co, Ni, W, Ti, Ta, Cu, Al, TiN and TaN, or any other suitable material.

Etch stop layer (ESL) 210 is deposited over the ILD layer 130 and covering the metal gate structures 140A to 140C, and the isolation structures 172, 174, and 192. The CESL 132 may be a dielectric layer including silicon nitride, silicon oxynitride or other suitable materials. The ESL 210 can be formed using, for example, plasma enhanced CVD, low pressure CVD, ALD or other suitable techniques.

ILD layer 220 is deposited over the ESL 210. The ILD layer 220 may include a material different from the ESL 210. In some embodiments, the ILD layer 220 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 220 may be formed using, for example, CVD, ALD, spin-on-glass (SOG) or other suitable techniques.

Vias 232 and 234 are formed in the ILD layer 220 and the ESL 210. In greater details, the via 232 is in contact with the metal gate structure 140A and 140C, and can also be referred to as gate via. The vias 234 are in contact with the source/drain contacts 200 and can also be referred to as source/drain vias. In some embodiments, the vias 232 and 234 may be formed by, for example, patterning the ILD layer 220 and ESL 210 to form via openings, filling the via openings with conductive material, and then performing a CMP process to remove excess conductive material until top surface of the ILD layer 220 is exposed. In some embodiments, the conductive material may include W, Co, Ru, TiN, Ti, TaN, Ta, Al, Mo, Ag, Sc, Hf, Sn, Au, Pt, Pd, or combinations thereof.

Figure 15:
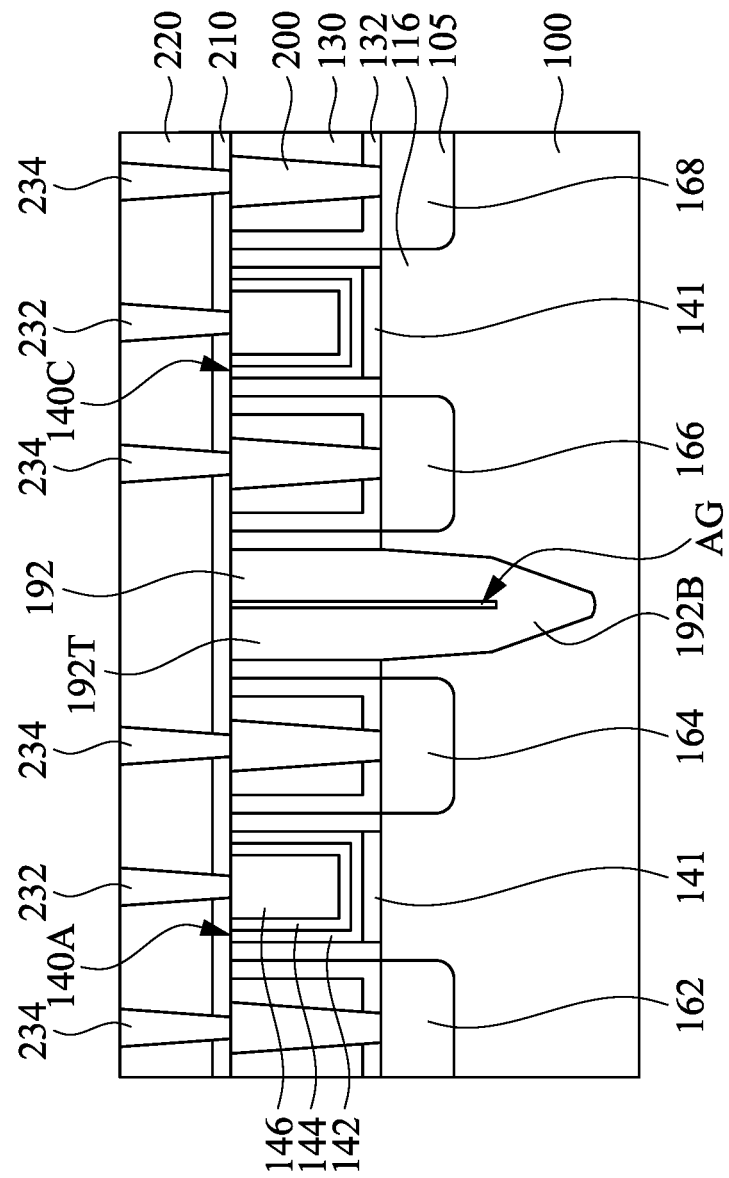
FIG. 15 illustrates a cross-sectional view of a semiconductor device in accordance with some embodiments of the present disclosure.

FIG. 15 illustrates a cross-sectional view of a semiconductor device in accordance with some embodiments of the present disclosure. The cross-sectional view of FIG. 15 is similar to the cross-sectional view of FIG. 14B, similar elements are labeled the same, and relevant details will not be repeated for brevity.

FIG. 15 is different from FIG. 14B, in that the isolation structure 192 includes an air gap AG. For example, during depositing the dielectric layer 190 (see FIGS. 12A to 12C), because the high aspect ratio of the opening O3 and the recess R2, the air gap AG may be formed in portion of the dielectric layer 190 filled in the opening O3 and the recess R2. Accordingly, after the CMP process described in FIGS. 13A to 13C is completed, the air gap AG may remain in the isolation structure 192.

Figure 16A:
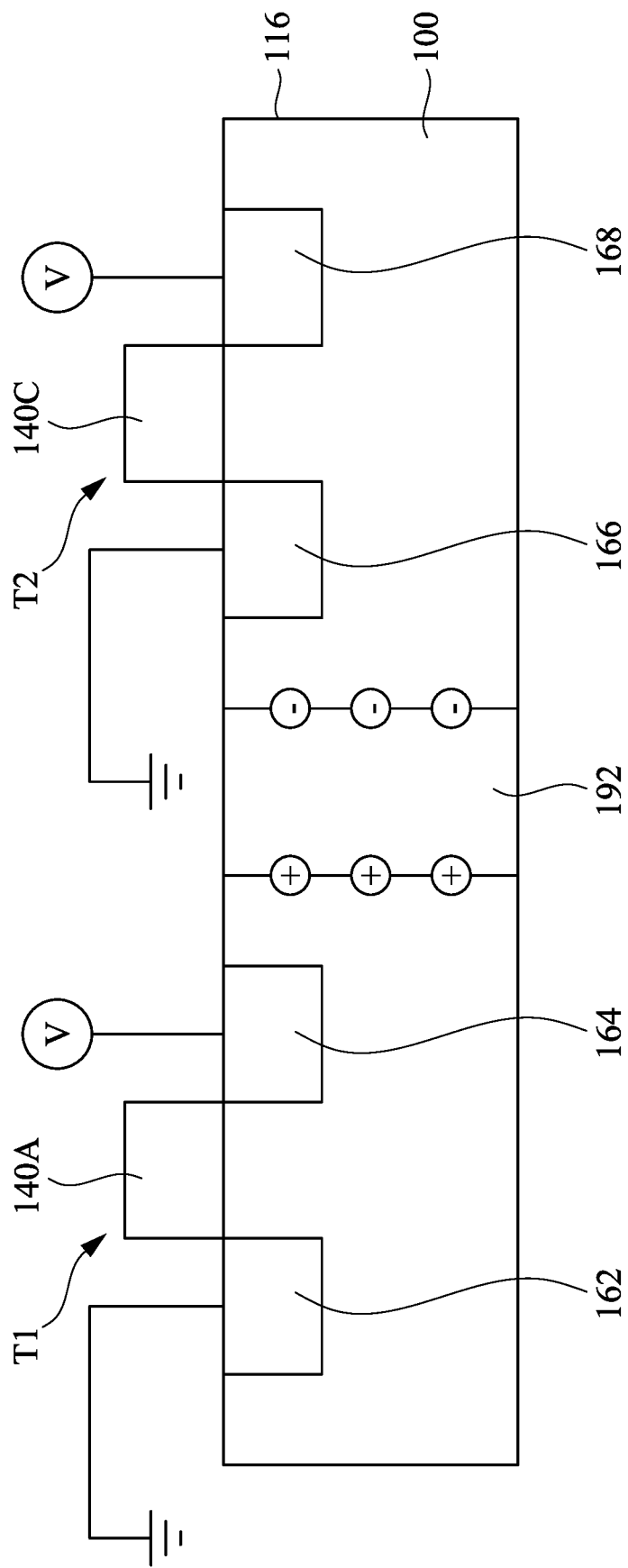
FIG. 16A illustrates a semiconductor device in accordance with some embodiments of the present disclosure.
Figure 16B:
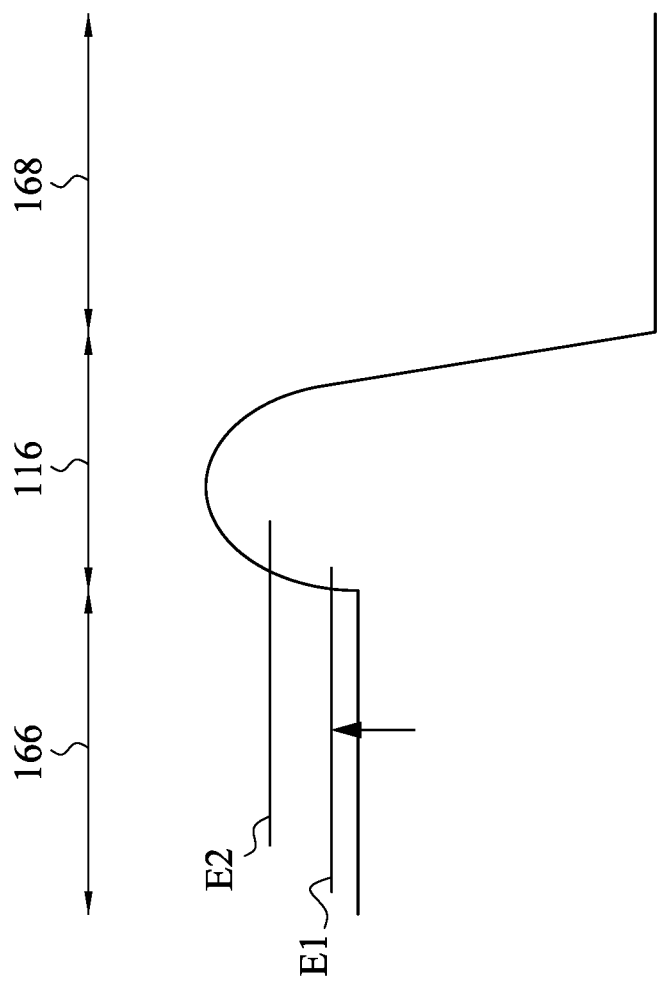
FIG. 16B is a band structure of a semiconductor device in accordance with some embodiments of the present disclosure.

FIG. 16A illustrates a semiconductor device in accordance with some embodiments of the present disclosure. FIG. 16B is a band structure of a semiconductor device in accordance with some embodiments of the present disclosure. It is noted that some elements described in FIG. 16A is similar to those described in FIGS. 1A to 14C, such elements are labeled the same, and relevant details will not be repeated for brevity.

In some embodiments, the metal gate structure 140A, the epitaxial source/drain structures 162, 164, and the portion of the semiconductor fins 116 (or 114) under the metal gate structure 140A may collectively serve as a first transistor T1. Similar, the metal gate structure 140C, the epitaxial source/drain structures 166, 168, and the portion of the semiconductor fins 116 (or 114) under the metal gate structure 140C may collectively serve as a second transistor T2. The isolation structure 192 is laterally between the first transistor T1 and the second transistor T2, so as to electrically isolate the first transistor T1 from the second transistor T2.

During operation of the first transistor T1 and the second transistor T2, the epitaxial source/drain structure 162 of the first transistor T1 and the epitaxial source/drain structures 166 of the second transistor T2 are grounded, and can be referred to as drain regions. On the other hand, bias may be applied to the epitaxial source/drain structure 164 of the first transistor T1 and the epitaxial source/drain structure 168 of the second transistor T2, which can be referred to as source regions. In some embodiments, during the operation of the first transistor T1 and the second transistor T2, charges may be accumulated at surfaces of the isolation structure 192, and will induce a parasitic capacitance.

Reference is made to the band structure of FIG. 16B, which is the band diagram of the second transistor T2. As mentioned above, the isolation structure 192 may induce a parasitic capacitance, which will affect the energy level of the epitaxial source/drain structure 166 of the second transistor T2. In some embodiments of the present disclosure, the isolation structure 192 may be made of a material having dielectric constant in a range from about 2 to about 4, the induced parasitic capacitance will raise the energy level of the epitaxial source/drain structure 166 to a level E1, which in turn will lower the barrier between the epitaxial source/drain structure 166 and the channel region (e.g., portion of the fins 116/114 under the metal gate structure 140B).

By contrast, if the isolation structure 192 is made of a dielectric material having dielectric constant being about 7 (e.g., SiN), more charges will be accumulated at surfaces of the isolation structure 192 due to high k value. Accordingly, the induced parasitic capacitance will raise the energy level of the epitaxial source/drain structure 166 to a level E2, which will even lower the barrier between the epitaxial source/drain structure 166 and the channel region. Such condition will negatively affect the device performance.

Based on the above discussions, it can be seen that the present disclosure offers advantages. It is understood, however, that other embodiments may offer additional advantages, and not all advantages are necessarily disclosed herein, and that no particular advantage is required for all embodiments. Embodiments of the present disclosure provide an isolation structure with lower dielectric constant between two adjacent transistors, so as to reduce the induced parasitic capacitance. With such configuration, the device performance may be improved.

In some embodiments of the present disclosure, a method includes forming a semiconductor fin over a substrate; forming first, second, and third gate structures over the substrate and crossing the semiconductor fin; forming first and second epitaxial source/drain structures over the semiconductor fin and on opposite sides of the first gate structure, and forming third and fourth source/drain epitaxial structures over the semiconductor fin and on opposite sides of the third gate structure; forming first gate spacers, second gate spacers, third gate spacers on opposite sidewalls of the first, second, and third gate structures, respectively; forming a first hard mask over the first, second, and third gate structures; patterning the first hard mask to form a first opening; etching a portion of the second gate structure and a portion of the semiconductor fin through the first opening of the first hard mask to form a recess; and forming a dielectric layer in the recess, in which a dielectric constant of the dielectric layer is lower than a dielectric constant of silicon oxide.

In some embodiments, forming the dielectric layer includes performing an atomic layer deposition (ALD) process, the ALD includes a first precursor and a second precursor, the first precursor including B2H6 or BNH6, and the second precursor including N2 or Ammonia.

In some embodiments, the method further includes performing a plasma treatment during performing the ALD process.

In some embodiments, the method further includes prior to forming the dielectric layer, forming isolation structures on opposite sides of the portion of the second gate structure, in which the dielectric constant of the dielectric layer is lower than a dielectric constant of the isolation structures.

In some embodiments, etching the portion of the second gate structure is performed to expose sidewalls of the isolation structures, and the dielectric layer is formed in contact with the isolation structures.

In some embodiments, a bottommost end of the recess is lower than a top surface of the substrate.

In some embodiments, the dielectric layer is formed in contact with the second gate spacers, and in which the dielectric constant of the dielectric layer is lower than a dielectric constant of the second gate spacers.

In some embodiments of the present disclosure, a method includes forming a semiconductor fin over a substrate; forming first, second, and third gate structures over the substrate and crossing the semiconductor fin; forming first and second epitaxial source/drain structures over the semiconductor fin and on opposite sides of the first gate structure, and forming third and fourth epitaxial source/drain structures over the semiconductor fin and on opposite sides of the third gate structure; forming a first isolation structure cutting the first, second, and third gate structures; etching a portion of the second gate structure and a portion of the semiconductor fin to form a recess; and forming a second isolation structure in the recess, in which a dielectric constant of the second isolation structure is lower than a dielectric constant of the first isolation structure.

In some embodiments, the second isolation structure is made of boron nitride.

In some embodiments, forming the first isolation structure includes forming a first hard mask over the first, second, and third gate structures; patterning the first hard mask to form a first opening exposing the first, second, and third gate structures; etching the first, second, and third gate structures through the first opening of the first hard mask to form a trench; and filling the trench with a dielectric layer.

In some embodiments, the first hard mask includes a first hard mask layer, a second hard mask layer over the first hard mask layer, and a third hard mask layer over the second hard mask layer, and in which the first and third hard mask layers are made of a dielectric material, and the second hard mask layer is made of a semiconductor material.

In some embodiments, the method further includes forming a second hard mask over the first hard mask, the second hard mask being vertically separated from the first hard mask by the dielectric layer, in which etching the portion of the second gate structure and the portion of the semiconductor fin includes performing a first etch to form a second opening in the first and second hard masks and to remove the portion of the second gate structure and the portion; and performing a second etch to remove the portion of the semiconductor fin, in which the second etch also removes the second hard mask and a portion of the dielectric layer to expose a top surface of the first hard mask.

In some embodiments, the second isolation structure is formed in contact with the first isolation structure.

In some embodiments, the second isolation structure is laterally between the second and third epitaxial source/drain structures.

In some embodiments of the present disclosure, a semiconductor device includes a substrate having a semiconductor fin, a first transistor over the semiconductor fin, a second transistor over the semiconductor fin. The first transistor includes a first gate structure, first gate spacers on opposite sidewalls of the first gate structure, and first and second epitaxial source/drain structures on opposite sides of the first gate structure. The second transistor includes a second gate structure, second gate spacers on opposite sidewalls of the second gate structure, and third and fourth epitaxial source/drain structures on opposite sides of the second gate structure. The semiconductor device includes a first isolation structure laterally between the second epitaxial source/drain structure and the third epitaxial source/drain structure. The semiconductor device includes spacers on opposite sidewalls of a top portion of the first isolation structure, in which the spacers are made of a same material as the first and second gate spacers, and a dielectric constant of the first isolation structure is lower than a dielectric constant of the spacers.

In some embodiments, the semiconductor device further includes a second isolation structure and a third isolation structure cutting the first and second gate structures, in which the second and third isolation structures are disposed on opposite sides of the first isolation structure, and in which the dielectric constant of the first isolation structure is lower than dielectric constants of the second and third isolation structures.

In some embodiments, the first isolation structure is in contact with the second and third isolation structures, and a top surface of the first isolation structure is substantially level with top surfaces of the second and third isolation structures.

In some embodiments, in a cross-section view perpendicular to a lengthwise direction of the semiconductor fin, the first isolation structure includes a main portion and a protrusion portion protruding from a bottom surface of the main portion, in which a width of the main portion continuously increases toward the substrate, and a width of the protrusion portion increases from a top level to an intermediate level in the protrusion portion and then decreases from the intermediate level to a bottom level of the protruding portion.

In some embodiments, the first isolation structure is made of boron nitride.

In some embodiments, the dielectric constant of the first isolation structure is in a range from about 2 to about 4.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a semiconductor fin over a substrate;
   forming first, second, and third gate structures over the substrate and crossing the semiconductor fin;
   forming first and second epitaxial source/drain structures over the semiconductor fin and on opposite sides of the first gate structure, and forming third and fourth source/drain epitaxial structures over the semiconductor fin and on opposite sides of the third gate structure;
   forming first gate spacers, second gate spacers, third gate spacers on opposite sidewalls of the first, second, and third gate structures, respectively;
   forming a first hard mask over the first, second, and third gate structures;
   patterning the first hard mask to form a first opening;
   etching a portion of the second gate structure and a portion of the semiconductor fin through the first opening of the first hard mask to form a recess; and
   forming a dielectric layer in the recess, wherein a dielectric constant of the dielectric layer is lower than a dielectric constant of silicon oxide.

2. The method of claim 1, wherein forming the dielectric layer comprises performing an atomic layer deposition (ALD) process, the ALD comprises a first precursor and a second precursor, the first precursor including $B_2H_6$ or $BNH_6$, and the second precursor including $N_2$ or Ammonia.

3. The method of claim 2, further comprising performing a plasma treatment during performing the ALD process.

4. The method of claim 1, further comprising prior to forming the dielectric layer, forming isolation structures on opposite sides of the portion of the second gate structure, wherein the dielectric constant of the dielectric layer is lower than a dielectric constant of the isolation structures.

5. The method of claim 4, wherein etching the portion of the second gate structure is performed to expose sidewalls of the isolation structures, and the dielectric layer is formed in contact with the isolation structures.

6. The method of claim 1, wherein a bottommost end of the recess is lower than a top surface of the substrate.

7. The method of claim 1, wherein the dielectric layer is formed in contact with the second gate spacers, and wherein the dielectric constant of the dielectric layer is lower than a dielectric constant of the second gate spacers.

8. A method, comprising:
   forming a semiconductor fin over a substrate;
   forming first, second, and third gate structures over the substrate and crossing the semiconductor fin;
   forming first and second epitaxial source/drain structures over the semiconductor fin and on opposite sides of the first gate structure, and forming third and fourth epitaxial source/drain structures over the semiconductor fin and on opposite sides of the third gate structure;
   forming a first isolation structure cutting the first, second, and third gate structures;
   etching a portion of the second gate structure and a portion of the semiconductor fin to form a recess; and
   forming a second isolation structure in the recess, wherein a dielectric constant of the second isolation structure is lower than a dielectric constant of the first isolation structure.

9. The method of claim 8, wherein the second isolation structure is made of boron nitride.

10. The method of claim 8, wherein forming the first isolation structure comprises:
    forming a first hard mask over the first, second, and third gate structures;
    patterning the first hard mask to form a first opening exposing the first, second, and third gate structures;
    etching the first, second, and third gate structures through the first opening of the first hard mask to form a trench; and
    filling the trench with a dielectric layer.

11. The method of claim 10, wherein the first hard mask comprises a first hard mask layer, a second hard mask layer over the first hard mask layer, and a third hard mask layer over the second hard mask layer, and wherein the first and third hard mask layers are made of a dielectric material, and the second hard mask layer is made of a semiconductor material.

12. The method of claim 10, further comprising forming a second hard mask over the first hard mask, the second hard mask being vertically separated from the first hard mask by the dielectric layer, wherein etching the portion of the second gate structure and the portion of the semiconductor fin comprises:
    performing a first etch to form a second opening in the first and second hard masks and to remove the portion of the second gate structure and the portion; and
    performing a second etch to remove the portion of the semiconductor fin, wherein the second etch also removes the second hard mask and a portion of the dielectric layer to expose a top surface of the first hard mask.

13. The method of claim 8, wherein the second isolation structure is formed in contact with the first isolation structure.

14. The method of claim 8, wherein the second isolation structure is laterally between the second and third epitaxial source/drain structures.

15. A method, comprising:
forming a first transistor and a second transistor over a semiconductor fin on a substrate, wherein each of the first transistor and the second transistor comprises:
a gate structure;
gate spacers on opposite sidewalls of the gate structure; and
epitaxial source/drain structures on opposite sides of the gate structure; and
forming a first isolation structure laterally between the first transistor and the second transistor, wherein opposite sidewalls of a top portion of the first isolation structure are covered by spacers, the spacers being made of a same material as the gate spacers, and a dielectric constant of the first isolation structure is lower than a dielectric constant of the spacers.

16. The method of claim 15, further comprising forming a second isolation structure and a third isolation structure cutting the gate structures of the first transistor and the second transistor, respectively, wherein the second and third isolation structures are disposed on opposite sides of the first isolation structure, and wherein the dielectric constant of the first isolation structure is lower than dielectric constants of the second and third isolation structures.

17. The method of claim 16, wherein the first isolation structure is in contact with the second and third isolation structures, and a top surface of the first isolation structure is substantially level with top surfaces of the second and third isolation structures.

18. The method of claim 15, wherein in a cross-section view perpendicular to a lengthwise direction of the semiconductor fin, the first isolation structure comprises a main portion and a protrusion portion protruding from a bottom surface of the main portion, wherein a width of the main portion continuously increases toward the substrate, and a width of the protrusion portion increases from a top level to an intermediate level in the protrusion portion and then decreases from the intermediate level to a bottom level of the protrusion portion.

19. The method of claim 15, wherein the first isolation structure is made of boron nitride.

20. The method of claim 15, wherein the dielectric constant of the first isolation structure is in a range from about 2 to about 4.

* * * * *